US009117529B2

(12) United States Patent
Karakulak et al.

(10) Patent No.: US 9,117,529 B2
(45) Date of Patent: Aug. 25, 2015

(54) INTER-CELL INTERFERENCE ALGORITHMS FOR SOFT DECODING OF LDPC CODES

(71) Applicant: STEC, Inc., Santa Ana, CA (US)

(72) Inventors: Seyhan Karakulak, San Diego, CA (US); Majid Nemati Anaraki, San Diego, CA (US); Anthony D. Weathers, San Diego, CA (US); Richard D. Barndt, San Diego, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 174 days.

(21) Appl. No.: 13/725,943

(22) Filed: Dec. 21, 2012

(65) Prior Publication Data

US 2013/0163328 A1    Jun. 27, 2013

Related U.S. Application Data

(60) Provisional application No. 61/580,142, filed on Dec. 23, 2011.

(51) Int. Cl.
| | |
|---|---|
| *G11C 16/00* | (2006.01) |
| *G11C 16/10* | (2006.01) |
| *G11C 11/56* | (2006.01) |
| *G11C 16/26* | (2006.01) |
| *G11C 16/28* | (2006.01) |

(52) U.S. Cl.
CPC ............ *G11C 16/10* (2013.01); *G11C 11/5642* (2013.01); *G11C 16/26* (2013.01); *G11C 16/28* (2013.01); *G11C 2211/5634* (2013.01)

(58) Field of Classification Search
CPC ........ G11C 16/04; G11C 16/26; G11C 16/34; G11C 16/3418; G11C 16/3427; G11C 16/10; G11C 11/5642; G11C 16/28; G11C 2211/5634
USPC ............. 365/185.18, 185.02, 185.09, 185.21; 711/103; 714/721
See application file for complete search history.

(56) References Cited

U.S. PATENT DOCUMENTS

| | | | | |
|---|---|---|---|---|
| 7,898,863 | B2 * | 3/2011 | Aritome | 365/185.18 |
| 8,467,248 | B2 * | 6/2013 | Aritome | 365/185.18 |
| 8,694,853 | B1 * | 4/2014 | Sommer | 714/763 |
| 2010/0195384 | A1 * | 8/2010 | Sharon et al. | 365/185.02 |
| 2011/0149658 | A1 * | 6/2011 | Aritome | 365/185.18 |
| 2011/0216586 | A1 * | 9/2011 | Graef et al. | 365/185.02 |
| 2011/0225350 | A1 * | 9/2011 | Burger et al. | 711/103 |
| 2011/0305082 | A1 * | 12/2011 | Haratsch et al. | 365/185.03 |
| 2013/0272064 | A1 * | 10/2013 | Aritome | 365/185.02 |

\* cited by examiner

*Primary Examiner* — J. H. Hur
*Assistant Examiner* — Xiaochun L Chen
(74) *Attorney, Agent, or Firm* — McDermott Will & Emery LLP

(57) ABSTRACT

Aspects of the subject technology relate to a method for reading information stored in a flash memory device. In some implementations, the method can include steps including, obtaining a first read signal of a first cell, wherein the first cell is located in a first word line and a first bit line in the flash memory device, obtaining a programming level of a second cell, wherein the second cell is located in a second word line and the first bit line, and wherein the second word line is adjacent to the first word line. In certain aspects, the method may further comprise steps for obtaining decoding information for the first cell based on the programming level of the second cell. A data storage system and article of manufacture are also provided.

30 Claims, 20 Drawing Sheets

LLR mapping tables with the one bin shifted voltage distributions with 150K cycled data Table 1: for bottom cell level 0.

|       | r1'      | r2'      | r3'      | r4'      |
|-------|----------|----------|----------|----------|
| L0/L1 | -11.6163 | 1.9555   | 10.2077  | 10.2077  |
| L1/L2 | -11.9081 | 4.4077   | 11.6771  | 11.6771  |
| L2/L3 | 6.5818   | -4.8898  | -12.8446 | -12.8446 |

Table 1: for bottom cell level 1.

|       | r1'      | r2'      | r3'     | r4'      |
|-------|----------|----------|---------|----------|
| L0/L1 | -13.9879 | -13.9879 | -1.3823 | 9.7402   |
| L1/L2 | -14.3271 | -14.3271 | 0.4916  | 11.4792  |
| L2/L3 | 8.6983   | 8.6983   | -0.2848 | -10.0651 |

Table 2: for bottom cell level 2.

|       | r1'      | r2'      | r3'      | r4'      |
|-------|----------|----------|----------|----------|
| L0/L1 | -11.6163 | 1.9555   | 10.2077  | 10.2077  |
| L1/L2 | -11.9081 | 4.4077   | 11.6771  | 11.6771  |
| L2/L3 | 6.5818   | -4.8898  | -12.8446 | -12.8446 |

Table 3: for bottom cell level 3.

|       | r1'      | r2'      | r3'     | r4'      |
|-------|----------|----------|---------|----------|
| L0/L1 | -13.9879 | -13.9879 | -1.3823 | 9.7402   |
| L1/L2 | -14.3271 | -14.3271 | 0.4916  | 11.4792  |
| L2/L3 | 8.6983   | 8.6983   | -0.2848 | -10.0651 |

FIG. 10

|        | 40K | 60K     | 80K     | 100K    | 150K    |
|--------|-----|---------|---------|---------|---------|
| 0hr    | 0   | 0       | 0       | 3.26E-04| 2.93E-03|
| 3hr (100C) | 0 | 3.26E-03 | 7.16E-03 | 7.81E-03 | 2.12E-02 |

FIG. 11A

|        | 40K | 60K | 80K     | 100K    | 150K    |
|--------|-----|-----|---------|---------|---------|
| 0hr    | 0   | 0   | 0       | 0       | 1.30E-03|
| 3hr (100C) | 0 | 0 | 1.30E-03 | 1.95E-03 | 6.84E-03 |

FIG. 11B

|        | 40K | 60K | 80K     | 100K    | 150K    |
|--------|-----|-----|---------|---------|---------|
| 0hr    | 0   | 0   | 0       | 0       | 1.30E-03|
| 3hr (100C) | 0 | 0 | 1.30E-03 | 1.95E-03 | 6.84E-03 |

FIG. 11C

|           | 40K | 60K      | 80K      | 100K     | 150K     |
|-----------|-----|----------|----------|----------|----------|
| 0hr       | 0   | 0        | 0        | 3.26e-04 | 2.93e-03 |
| 3hr (100C)| 0   | 3.26e-03 | 7.16e-03 | 7.81e-03 | 2.12e-02 |

FIG. 14A

|           | 40K | 60K | 80K      | 100K     | 150K     |
|-----------|-----|-----|----------|----------|----------|
| 0hr       | 0   | 0   | 0        | 0        | 1.30e-03 |
| 3hr (100C)| 0   | 0   | 1.30e-03 | 1.95e-03 | 6.84e-03 |

FIG. 14B

|           | 40K | 60K | 80K | 100K     | 150K     |
|-----------|-----|-----|-----|----------|----------|
| 0hr       | 0   | 0   | 0   | 0        | 0        |
| 3hr (100C)| 0   | 0   | 0   | 3.26e-04 | 2.60e-03 |

FIG. 14C

|           | 40K | 60K | 80K | 100K | 150K |
|-----------|-----|-----|-----|------|------|
| 0hr       | 0   | 0   | 0   | 0    | 0    |
| 3hr (100C)| 0   | 0   | 0   | 0    | 0    |

FIG. 14D

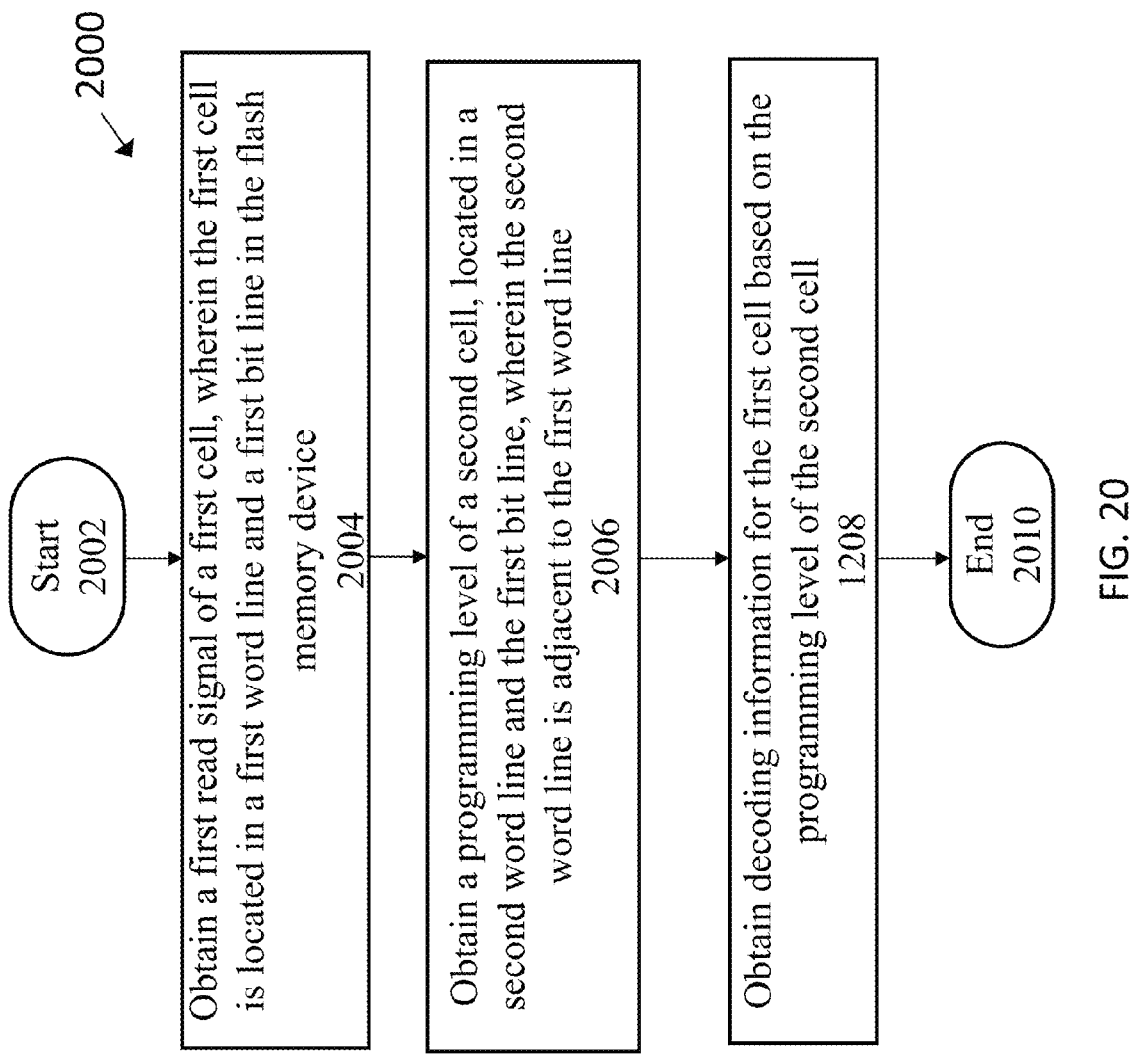

INTER-CELL INTERFERENCE ALGORITHMS FOR SOFT DECODING OF LDPC CODES

This application claims the benefit of U.S. Provisional Patent Application No. 61/580,142, filed Dec. 23, 2011, entitled "INTER-CELL INTERFERENCE ALGORITHMS FOR SOFT DECODING OF LDPC CODES," which is expressly incorporated herein by reference in its entirety.

BACKGROUND

The present disclosure relates to the retrieval of information stored on flash memory devices, such as solid-state drives. Particularly, the present disclosure pertains to algorithms for decoding soft low-density parity check (LDPC) codes that take into consideration inter-cell interference (ICI).

SUMMARY

In certain aspects, the subject technology relates to a method for reading information stored in a flash memory device, including obtaining a first read signal of a first cell, wherein the first cell is located in a first word line and a first bit line in the flash memory device, obtaining a programming level of a second cell, wherein the second cell is located in a second word line and the first bit line, and wherein the second word line is adjacent to the first word line. In certain aspects, the memory may further include obtaining decoding information for the first cell based on the programming level of the second cell.

In certain aspects, the subject technology relates to a data storage system, including a configuration memory, a plurality of memory cells and a controller coupled to the configuration memory and the plurality of memory cells, wherein the controller is configured to perform operations for obtaining a first read signal of a first cell, wherein the first cell is located in a first word line and a first bit line in the data storage system. The controller may be further configured to perform operations for obtaining a programming level of a second cell, wherein the second cell is located in a second word line and the first bit line, and wherein the second word line is adjacent to the first word line and obtaining decoding information for the first cell based on the programming level of the second cell.

In yet another aspect, the subject technology relates to an article of manufacture for providing soft information to facilitate decoding of information read from an electronic storage. In certain implementations, the article of manufacture includes at least one non-transitory processor readable storage medium and instructions stored on the at least one medium, wherein the instructions are configured to be readable from the at least one medium by at least one processor and thereby cause the processor to perform operations for obtaining a first read signal of a first cell, wherein the first cell is located in a first word line and a first bit line in a flash memory device and obtaining a programming level of a second cell, wherein the second cell is located in a second word line and the first bit line, and wherein the second word line is adjacent to the first word line. In certain aspects, the operations may further include obtaining decoding information for the first cell based on the programming level of the second cell.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 10 illustrates various log-likelihood ratio (LLR) mapping tables associated with a bottom programming level, according to some aspects of the present disclosure.

FIGS. 11A-11C illustrate examples of tables of sector failure rates for a traditional hard decision decoding scheme, a decoding scheme that does not consider ICI, and a soft decoding scheme using a voltage shift method to mitigate ICI, respectively, according to some aspects of the present disclosure.

FIGS. 14A-14D illustrate examples of tables of sector failure rates for a hard decision decoding scheme, a decoding scheme that does not consider ICI, and decoding schemes that use programming level voltage distribution and MSB/LSB pages voltage distributions for ICI mitigation, respectively, according to some aspects of the present disclosure.

FIG. 20 illustrates an example of a method for reading information stored in a flash memory device, according to some aspects of the disclosure.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In flash memory devices, the threshold voltage level of a cell may be increased when the neighboring cells are programmed. An increase in the threshold voltage level of a cell due to programming its neighbors is called ICI. The impact of the voltage shift effects caused by ICI is pattern dependent and depends on the flash device operating conditions, such as endurance cycles, retention, and the ambient temperature for programming and reading the flash device. Further, ICI depends on the number of bits programmed per cell and the density of the cells. With the continuing demands for smaller flash devices, ICI is expected to increase substantially. Such increase in ICI could substantially degrade a flash system's performance if its effect is not mitigated in detection and decoding steps.

Figure 1:
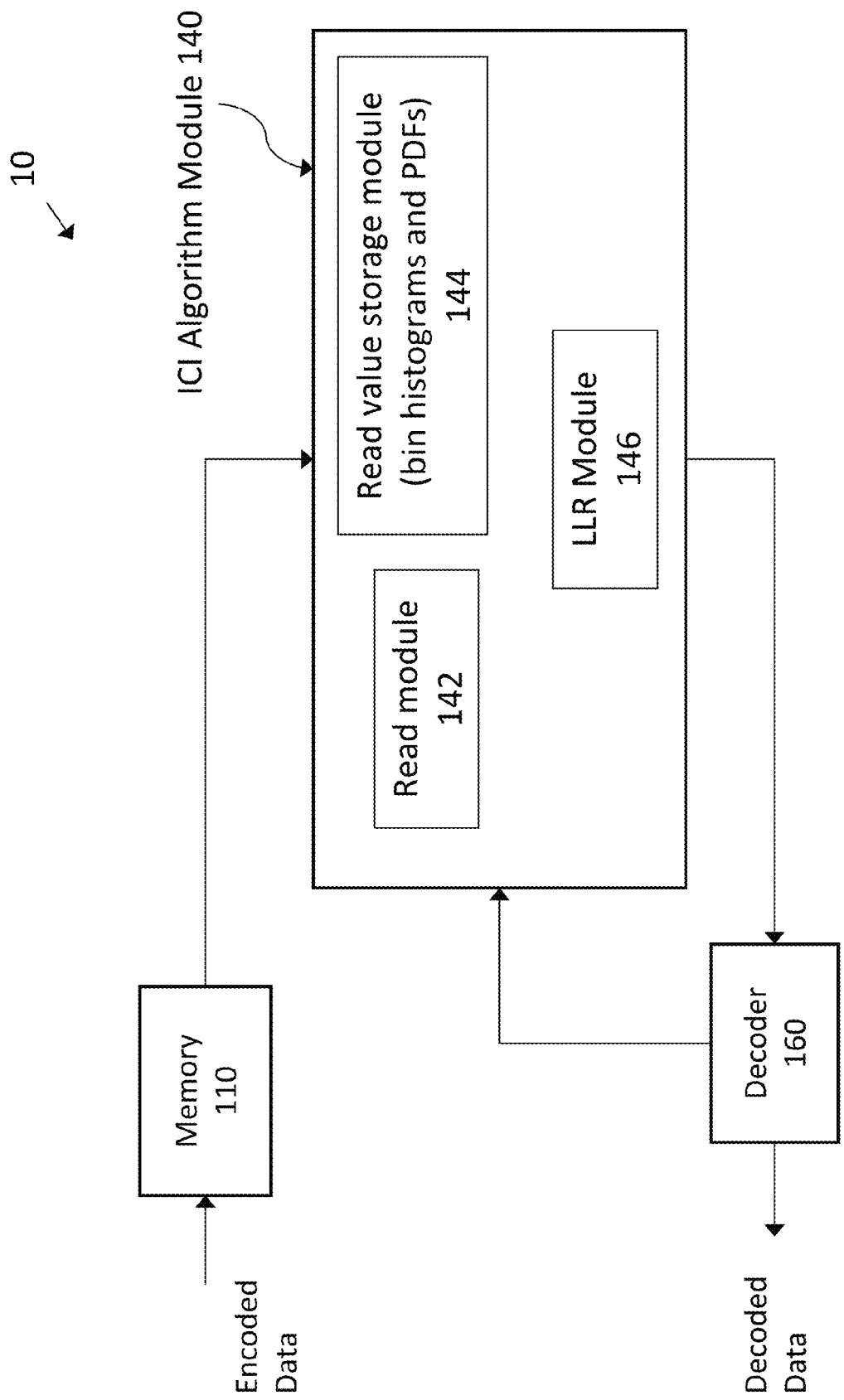
FIG. 1 is a flow diagram illustrating an example of a flash system using an ICI algorithm module, according to some aspects of the present disclosure.

FIG. 1 is a flow diagram illustrating an example of a system 10 for decoding information stored on a flash memory device using an ICI algorithm module 140, according to some aspects of the present disclosure. ICI algorithm module 140 includes a read module 142, read value storage module 144, and a LLR module 146. In some implementations, the read value storage module 144 and the LLR module 146 can be one module. Specifically, FIG. 1 illustrates a flash system that considers the bit line ICI in the detection step. In this system, the encoded data is written to flash memory 110 in a known manner. The encoded data is read from the flash memory 110 by read module 142 in one read or multiple reads. In one implementation, the read values obtained from the flash memory are stored in read value storage module 144, from which the LLR module 146 draws read values from to generate LLR values.

Unlike traditional detection module of other flash systems, the LLR module 146 and read value storage module 144 of the present disclosure generate LLR values based on the bottom programming level to mitigate the effect of ICI. The term "bottom programming level" as used throughout the description of the present disclosure means the programming level a memory cell that is located on a word line that is below a word line of a subject target memory cell. Therefore, the output of the ICI algorithm module 140 produces more reliable data that can be used by decoder 160.

In some implementations, decoder 160 generates new soft information and feeds the information back to the ICI algorithm module 140. In some implementations, the decoder 160 feeds the information to the ICI algorithm module 140. In certain aspects, in the presence of constrained codes, ICI algorithm module 140 can consider the constraints in the detection process. In some implementations, the ICI algorithm module 140 and the decoder 160 can also process hard decisions inputs.

Figure 2:
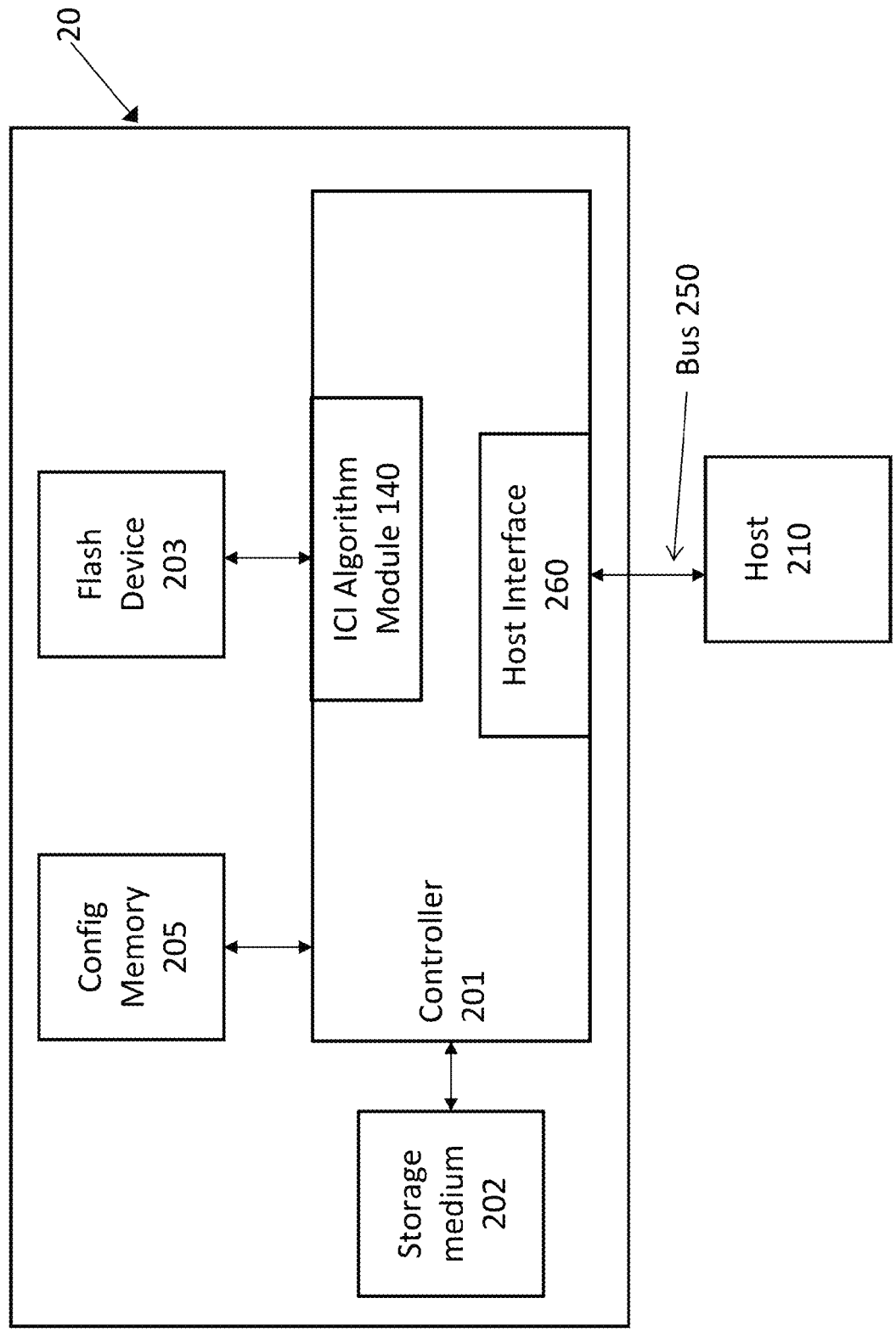
FIG. 2 is a block diagram illustrating components of a flash memory device according to one aspect of the present disclosure.

FIG. 2 is a block diagram illustrating example components of a data storage system 20 (for example, a solid state drive), according to one aspect of the present disclosure. Data storage system 20, for example, a solid state drive may include a data storage controller 201, storage medium 202, configuration memory 205, and flash device 203. Controller 201 may use storage medium 202 for temporary storage of data and information used to manage data storage system 200. Controller 201 may include several internal components (not shown) such as one or more processors, a read-only memory, a flash component interface (for example, a multiplexer to manage instruction and data transport along a serial connection to flash device 203), an I/O interface, error correction circuitry, and the like. In some aspects, all of these elements of controller 201 may be integrated into a single chip. In other aspects, these elements may be separated on their own PC board.

Controller 201 may also include a storage processor configured to execute code or instructions to perform the operations and functionality described herein, manage request flow and address mappings, and to perform calculations and generate commands. The processor of controller 201 is configured to monitor and control the operation of the components in data storage controller 201. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 201 and/or its processor. One or more sequences of instructions may be software stored and read from storage medium 202, flash device 203, or received from host device 210 (for example, via a host interface). ROM, storage medium 202, flash device 203, represent examples of machine or computer readable media on which instructions/code executable by controller 201 and/or its processor may be stored. Machine or computer readable media may generally refer to any medium or media used to provide instructions to controller 201 and/or its processor, including both volatile media, such as dynamic memory used for storage media 202 or for buffers within controller 201, and non-volatile media, such as electronic media, optical media, and magnetic media.

In some aspects, controller 201 is configured to store data received from host device 210 in flash device 203 in response to a write command from host device 210. Controller 201 is further configured to read data stored in flash memory 203 and to transfer the read data to host device 210 in response to a read command from host device 210. As will be described in more detail below, controller 201 is configured to make the ICI algorithm module 140 operable to generate statistics and particularly LLR values for read values obtained from a flash channel for decoding. By taking into account the inter-cell interference statistics, and in particular the inter-cell interference in the bit line direction, the present disclosure improves SSD performance and reduce error rates compared to performance of SSD using flash memory cells in the same application environment without word line ICI detection.

Host device 210 represents any device configured to be coupled to data storage system 200 and to store data in data storage system 200. Host device 204 may be a computing system such as a personal computer, a server, a workstation, a laptop computer, PDA, smart phone, and the like. Alternatively, host device 204 may be an electronic device such as a digital camera, a digital audio player, a digital video recorder, and the like.

In some aspects, storage medium 202 represents volatile memory used to temporarily store data and information used to manage data storage system 200. According to one aspect of the present disclosure, storage medium 202 is random access memory (RAM) such as double data rate (DDR) RAM. Other types of RAM also may be used to implement storage medium 202. Storage medium 202 may be implemented using a single RAM module or multiple RAM modules. While storage medium 202 is depicted as being distinct from controller 201, those skilled in the art will recognize that storage medium 202 may be incorporated into controller 201 without departing from the scope of the present disclosure. Alternatively, storage medium 202 may be a non-volatile memory such as a magnetic disk, flash memory, peripheral SSD, and the like.

As further depicted in FIG. 2, data storage system 200 may also include bus 250. The bus 250 may use suitable interfaces standard including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

Host device 210 and data storage system 20 can be in communication with each other via a wired or wireless connection and may be local to or remote from one another. According to some implementations, data storage system 20 can include pins (or a socket) to mate with a corresponding socket (or pins) on host device 210 to establish an electrical and physical connection. According to one or more other implementations, data storage system 20 includes a wireless transceiver to place host device 210 and data storage system 20 in wireless communication with each other.

Data storage system 20 may further include a host interface 260. Host interface 260 is configured to be coupled to host device 210, to receive data from and send data to host device 210. Host interface 260 may include both electrical and physical connections for operably coupling host device 210 to controller 201. Host interface 260 is configured to communicate data, addresses, and control signals between host device 210 and controller 201.

Flash device 203 represents a non-volatile memory device for storing data. According to one aspect of the present disclosure, flash device includes, for example, a NAND flash memory. Flash device 203 may include a single flash memory device or chip, and may include multiple flash memory devices or chips arranged in multiple channels. Flash device 203 is not limited to any particular capacity or configuration. For example, the number of physical blocks, the number of physical pages per physical block, the number of sectors per physical page, and the size of the sectors may vary within the scope of the present disclosure.

Flash memory may have a standard interface specification. This standard ensures that chips from multiple manufacturers can be used interchangeably (at least to a large degree). The interface may further hide the inner working of the flash memory and return only internally detected bit values for data.

Figure 3:
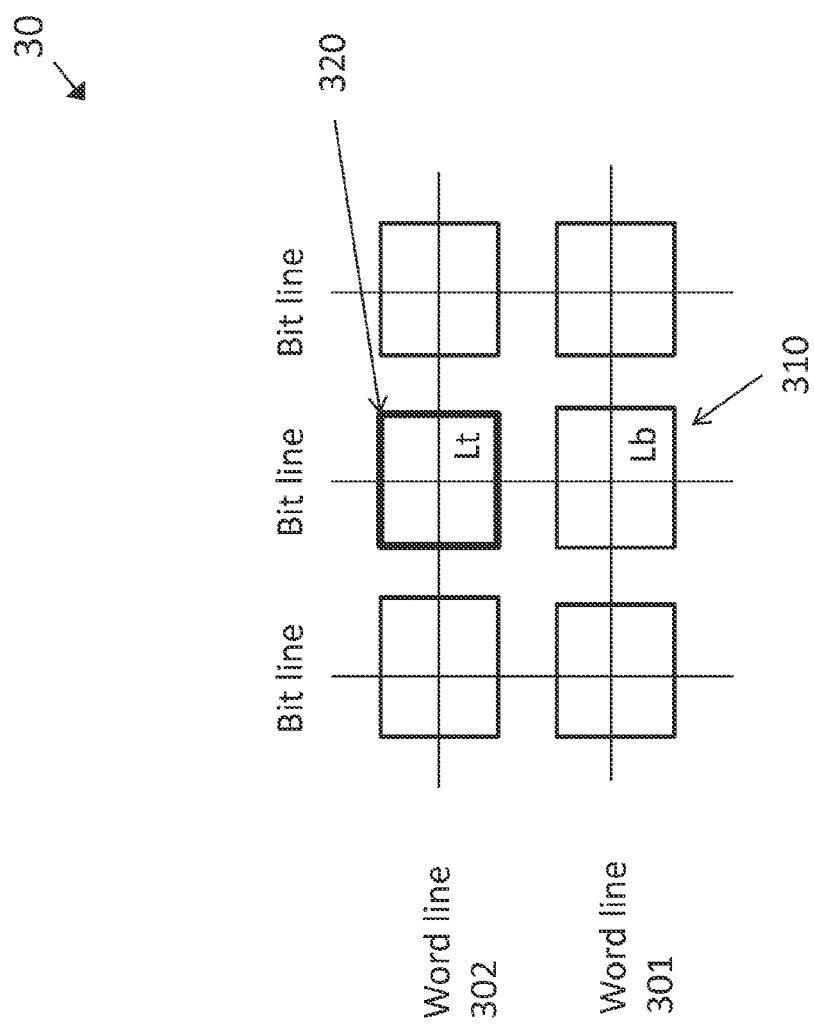
FIG. 3 illustrates a portion of a memory array of a flash memory device, according to some aspects of the present disclosure.

FIG. 3 illustrates a portion of a memory array 30 comprising memory cells of flash device 203, according to some aspects of the present disclosure. Data stored in target memory cell 320 may be affected data stored in the adjacent cells. In particular, data stored in adjacent cells may cause interferences that result in voltage shifts of target cell 320. The interference or ICI and can be more damaging as the number of bits stored per cell increases or the cell density increases.

Particularly, ICI is largely affected by data stored in memory cells in the bit lines below and above target cell 320. For example, when target cell 320 is programmed, the data stored in target cell 320 may be affected by bottom cell 310 that has programming level $L_b$. In other words, the programming level $L_b$ in bottom cell may cause voltage shifts in programming level $L_t$ of target cell 320. For example, the ICI created by bottom cell 310 that was programmed at L3 may cause the target cell 320 to be read as L2 when it was programmed at L1.

Traditional flash drive devices do not take the described ICI effects into consideration. Because no ICI mitigation is employed in these devices, the decoding performance degrades. In various exemplary implementations of the present disclosure, ICI is taken into consideration.

Figure 4:
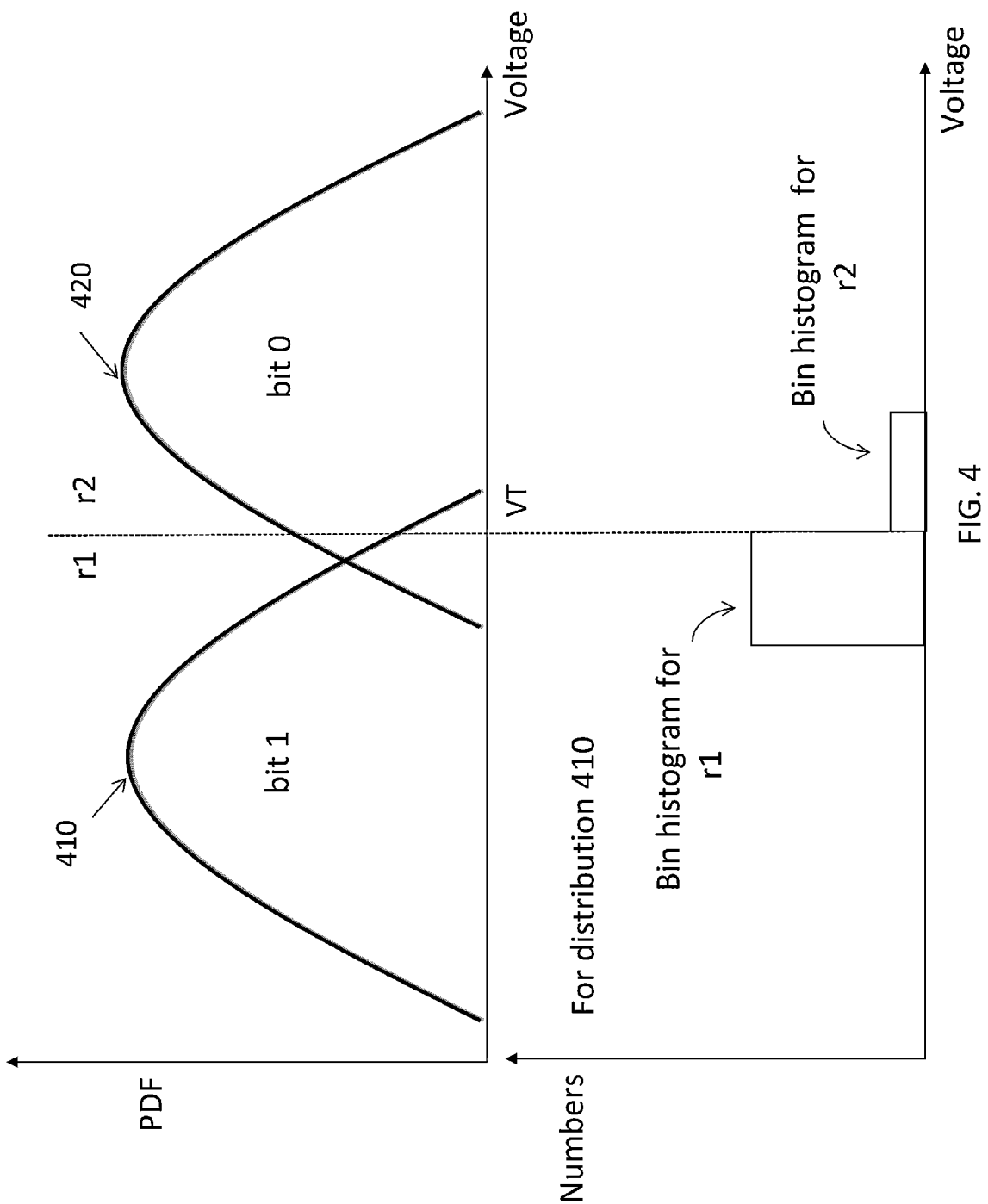
FIG. 4 illustrates probability density functions (PDFs) associated with probability of data bits being zero or one, as a function of voltage, as well as corresponding histograms, according to some aspects of the present disclosure.

In various implementations, data is read by the read module 142 from the memory 110 in one read cycle or multiple read cycles. FIG. 4 illustrates voltage distributions or probability density functions (PDFs) associated with probability of data bits being 0 or 1, as a function of voltage, as well as the corresponding histograms, according to some aspects of the present disclosure. Particularly, FIG. 4 illustrates an example of a one-read cycle according to some implementations. During a read cycle, the read module 142 applies a reference voltage Vt to individual memory cells of memory 110. For a given memory cell, the read module 142 determines whether a voltage level of the memory cell is higher or lower compared to the applied reference voltage Vt and puts the read output result in bin r1 or bin r2. When all the memory cells are read, the results can be generated in forms of PDFs (top graph) and/or their corresponding histograms (bottom graph). Distribution 410 represents a PDF for 'bit 1' and distribution 412 represents a PDF for 'bit 0.'

Figure 5:
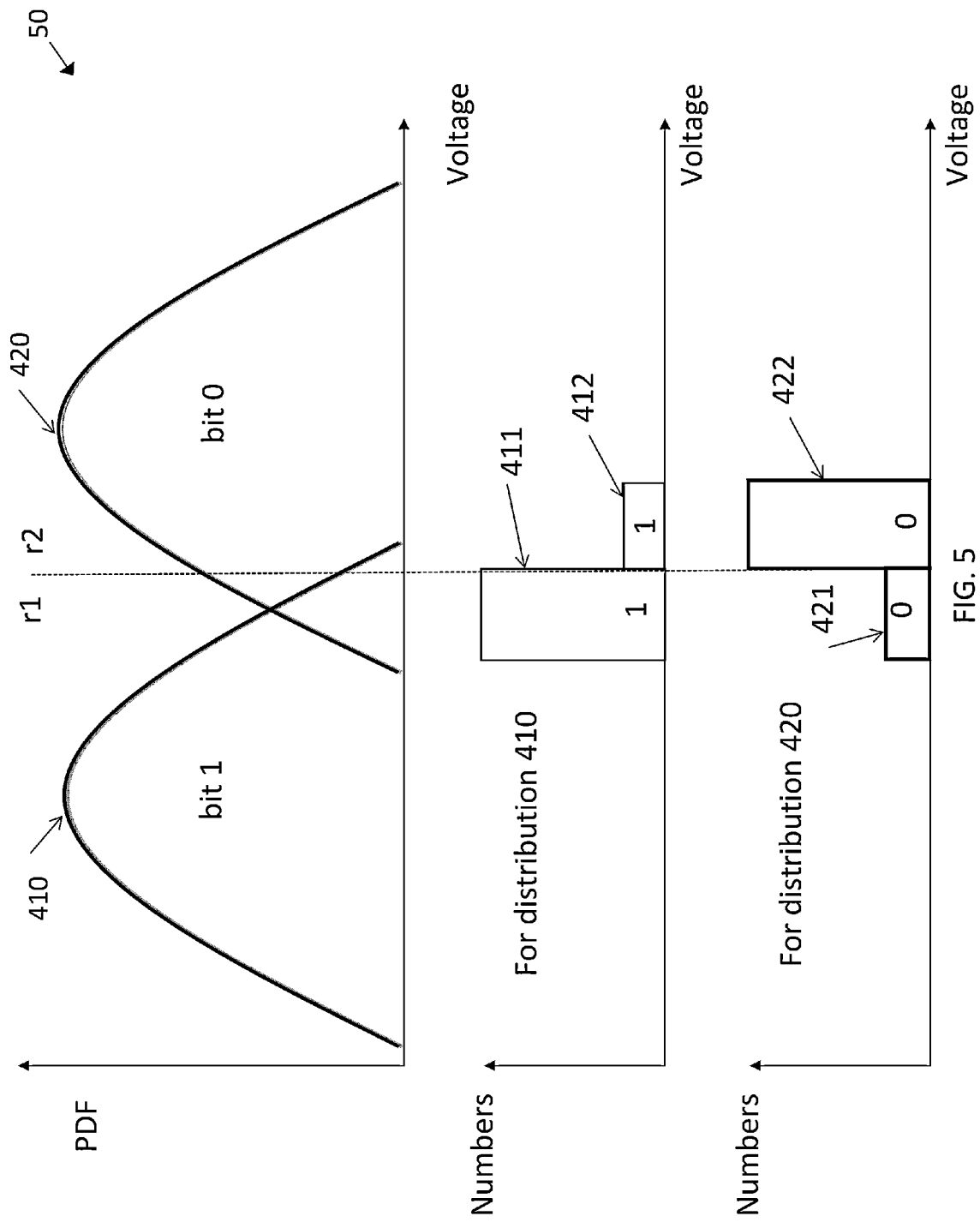
FIG. 5 illustrates PDFs associated with data bits zero and one that are used for LLR values calculation, as well as corresponding histograms, according to some aspects of the present disclosure.

FIG. 5 illustrates histograms of PDFs associated with data bits 0 and 1 of FIG. 4 that are used for LLR value calculations, according to some aspects of the present disclosure. From training data, the PDFs of distributions 410 and 420 are known. From the known training data and the read values obtained from memory cells, histograms for distribution 410 are constructed. That is, memory cells that were programmed as bit 1 but had read values that fall in region r1 are tallied in bin 411 and memory cells that were programmed as bit 1 but had read values that fall in region r2 are tallied in bin 412. The same is done for distribution 420. Memory cells that were programmed as bit 0 but had read values that fall in region r1 are tallied in bin 421 and memory cells that were programmed as bit 0 but had read values that fall in region r2 are tallied in bin 422.

Based on these obtained histograms, the LLR module 146 outputs the LLR value. If the memory cell is a MLC, multiple reference voltages have to be used to estimate other bits stored in the memory cell.

The LLR module 146 generates estimates relating to whether a bit zero or a bit one is stored in a memory cell in the form of LLR values. Thus, the LLR values are indicative of a confidence in 0 or 1, for each data bit read from memory 110. Based on the estimated LLR values for the data bits, the decoder module 160 decodes the data. Estimation of LLR values directly affects the decoder performance, and the performance of the memory system 10. The LLR values corresponding to each bin can be computed by means of the histograms of each bin obtained from training data, given by:

$$LLR = \log\frac{\rho(ri \mid x = 0)}{\rho(ri \mid x = 1)} \quad (1)$$

where x is the programmed bit input in "0" or "1", i is the bin number, and r1 is the obtained read value in terms of bin information (e.g., bin r1 or bin r2).

Figure 6:
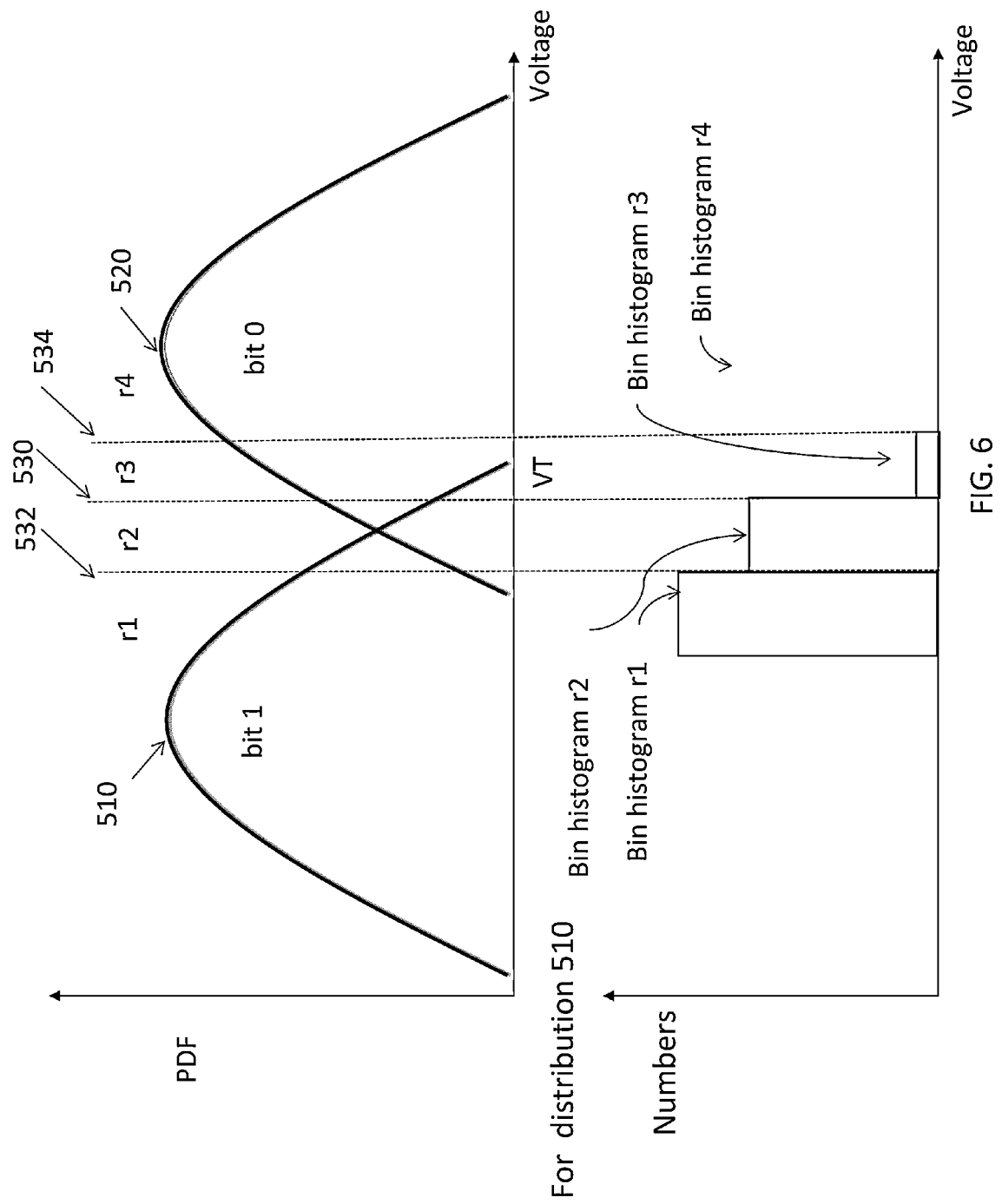
FIG. 6 illustrates a multiple read cycles around a threshold voltage level and bins associated with the multiple read cycles for PDF 510, according to some aspects of the present disclosure.

FIG. 6 schematically illustrates PDFs associated with probabilities of a data bit being 0 or 1, as a function of voltage, and also illustrates corresponding bin histograms according to one implementation of the present disclosure in a case of multiple read cycles. In the example illustrated in FIG. 6, it is again assumed that the memory cells are SLCs. For MLC cells, there is another similar figure for another bit. Distributions 510 and 520 represent the PDFs of data bits 1 and 0, respectively.

In a read operation as previously discussed, the read module 142 administers a reference voltage level Vt at line 530 to the memory cells of memory 110. The read module 142 then determines whether voltage levels of the memory cells are below or above voltage level Vt at line 530. A histogram indicating which cells are below or above voltage level Vt is kept by the read value storage module 144. The read module 142 may administers multiple read cycles. In some implementations, three read cycles (N=3) were conducted. Reference voltages at lines 532 and 534 are then applied for the second and third cycle, respectively. The read module 142 then determines whether voltage levels of the memory cells are below or above the voltage levels at lines 532 and 534. A histogram indicating which cells are below or above the three reference voltage levels are kept. The result is a histogram of different bins illustrated in the bottom graph FIG. 6. Because there are three read cycles (N=3), the voltage window is partitioned into four (N+1) different bins, and as a result, there are four bin histograms r1-r4. While the bottom graph represents only the histograms for voltage distribution 510, it is understood that there are other histograms for voltage distribution 520.

In one implementation, the LLR module 146 generates LLR values for each bin based on the generated histograms and stores the result in storage module 144. Storage module 144 also stores all the read values obtained from the read module 142 and the results generated by the LLR module 146, including the histograms, bin indices, and PDFs of the memory cells. In some implementations, storage module 144 also stores a look-up table that maps bin indices of bin histograms to the corresponding LLRs.

Figure 7:
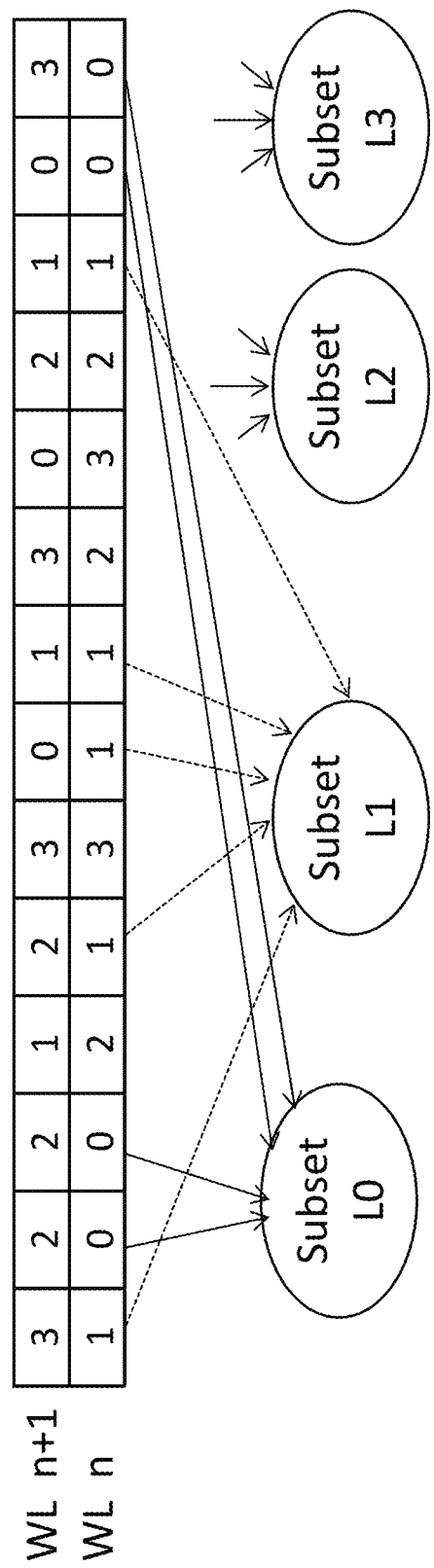
FIG. 7 conceptually illustrates an example of a sub grouping concept based on bottom programming levels according to some aspects of the present disclosure.

FIG. 7 illustrates a concept of sub-grouping based on the bottom programming levels in accordance with various implementations of the present disclosure. The programming levels for the cells of interest are on word line (WL) n+1 and for the bottom cells on word line n. Word line n locates right below word line n+1. The cells on word line n+1 are the subject of interest and the data is read back from flash memory. Programming levels of the bottom cell on word line n+1 are used for sub-grouping. Subset L0 indicates a sub-grouping of cells on word line n, where each of the cells in the subgroup has a bottom programming level of L0. In this example, Subset L0 has target cells at levels L2, L2, L0, and L3 and each of the target cells has a bottom cell with a programming level of L0. The cells of interest and the programming level, together with data read from the flash, are used to construct PDFs, statistics based on the subsets, voltage shifts, and subsequently LLR mapping tables for various implementations of the present disclosure.

Figure 8:
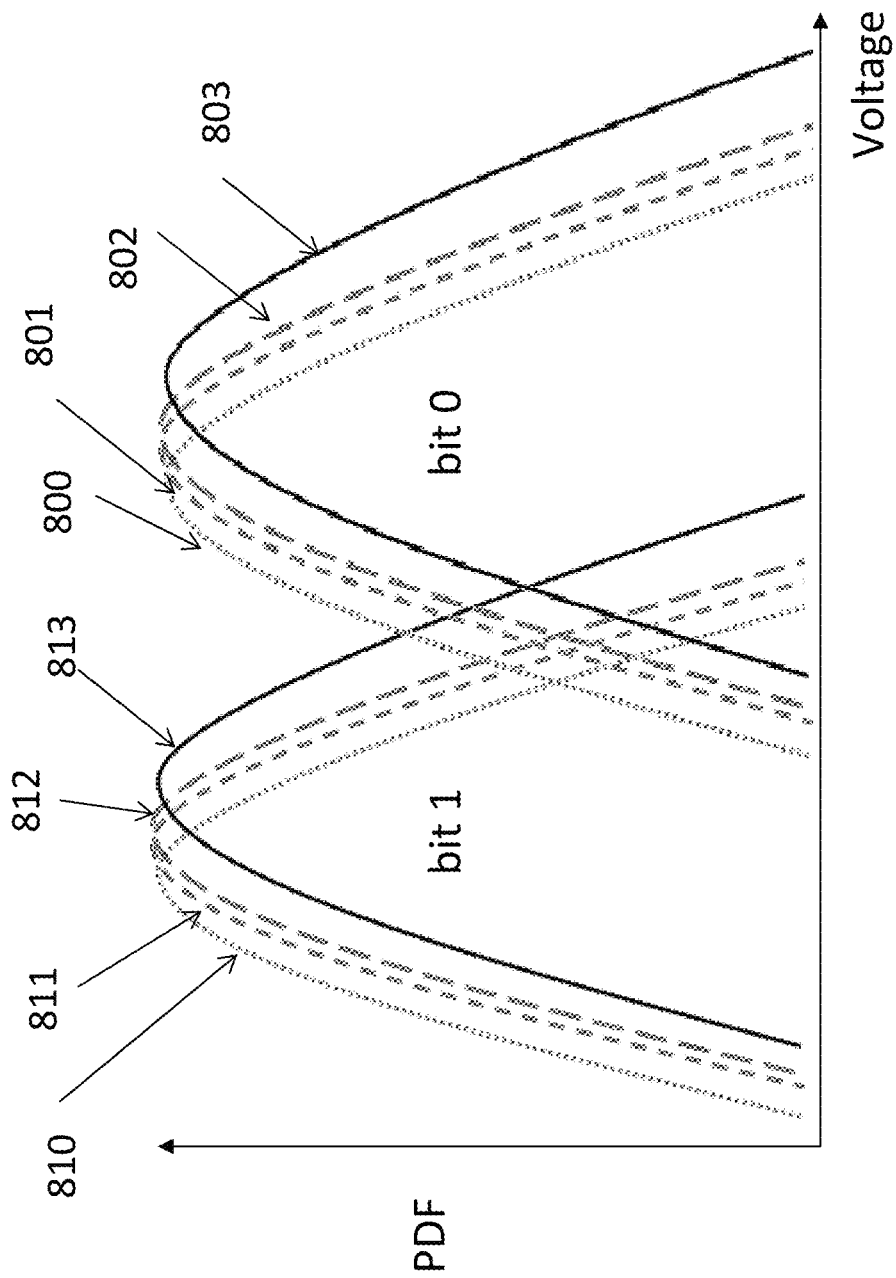
FIG. 8 illustrates various conditional PDFs associated with probability of data bits being zero or one, for various groups of cells, where each of the cells in the groups has a bottom cell with a programming level at L0, L1, L2, or L3, according to some aspects of the present disclosure.

FIG. 8 illustrates PDFs based on Subset L0, Subset L1, Subset L2, and Subset L3 of FIG. 7. For example, Subset L0 is used to construct distributions 810 and 800, which illustrate PDFs for data bit one and data bit zero, respectively for a SCL case. As mentioned previously, each of the cells in Subset L0 has a bottom cell with programming level L0. Similarly, distributions 811 and 801 illustrate PDFs for data bit one and data bit zero, respectively based on a sub-group of cells, Subset L2, where each of the cells in Subset L2 has a bottom cell with programming level L2. Distributions 812 and 802 illustrate PDFs of Subset L1, where each of the cells in Subset L1 has a bottom cell with programming level L1, and distributions 813 and 803 illustrate PDFs of Subset L3, where each of the cells in the Subset L3 has a bottom cell with programming level L3.

Compared to the case where the bottom cell is programmed to level 0, other programming levels (e.g., L1, L2, and L3) can cause shifts in the voltage distributions. Note that in certain aspects, the degree of ICI is mainly due to the programming order. In some implementations, MSB page programming introduces more ICI as compared to LSB page programming. Therefore, programming levels L1 and L3 can introduce greater shifts in the voltage distributions as compared to programming levels L0 and L2. While PDFs for data bits one and zero of one programming level are shown in FIG. 8, there are other PDFs for other programming levels and in general, they all show the similar effects as the illustrated implementation.

Because of these shifts in voltage distributions, the read output from a memory cell causes decoding errors. Therefore, in various implementations, different ICI algorithms are used to mitigate the errors caused by the interfering cells, and particularly by the bottom cells. There are three ICI algorithms that can be used. The preferences of using one over another may depend on various factors, such as the age of a memory device, the extent of the failure rates, costs, operating conditions, and hardware capabilities, etc.

Figure 9:
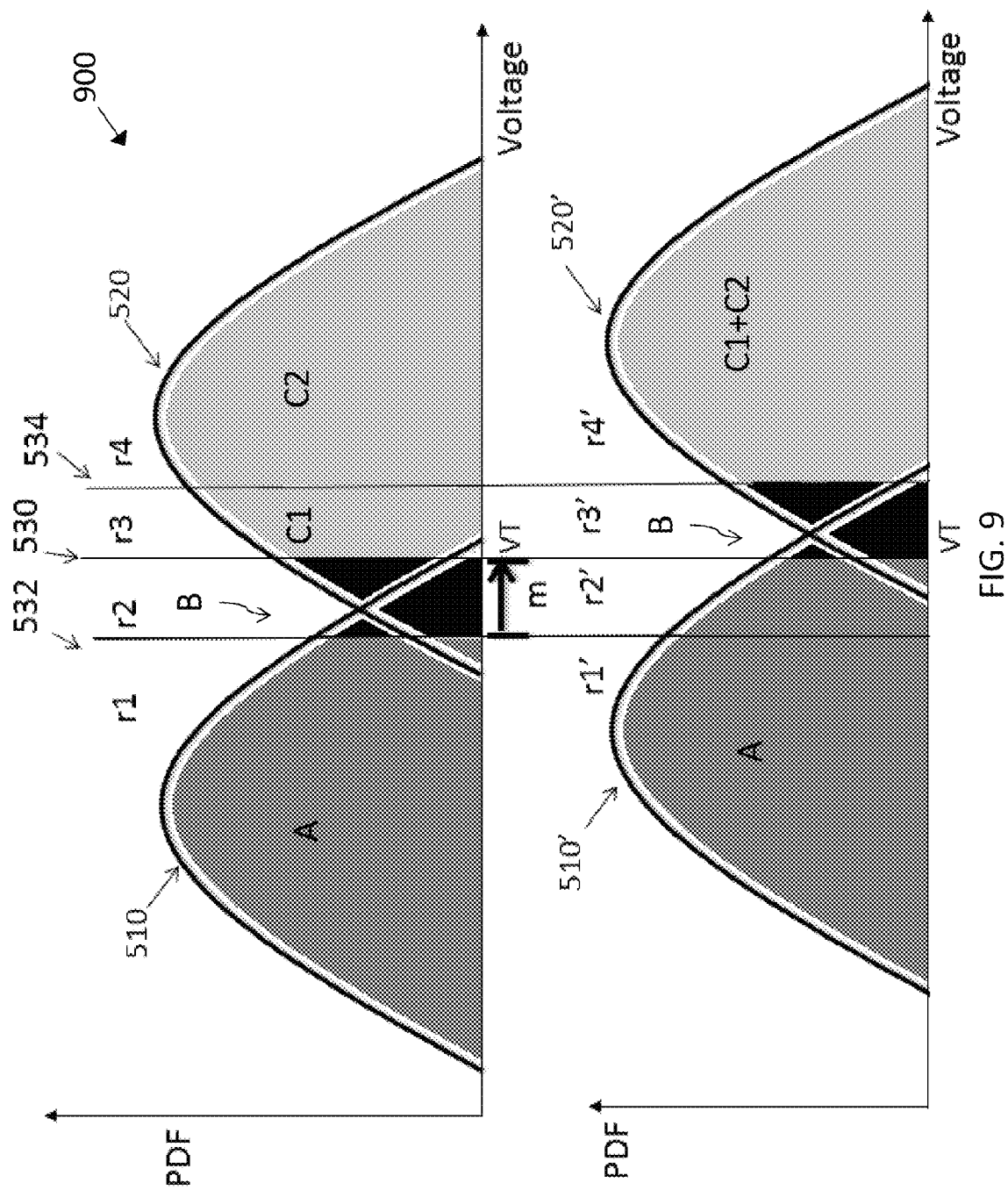
FIG. 9 schematically illustrates a shift in the PDFs due to ICI caused by the bottom cells, according to some aspects of the present disclosure.

FIG. 9 illustrates the concept of method 900 of mitigating the effects of ICI. Particularly, FIG. 9 schematically illustrates a shift in the PDFs for data bits one and zero due to ICI caused by the bottom cells, according to some aspects of the present disclosure. Certain predictions can be made about the change in the histograms depending on the bottom programming level in the presence of ICI. In some aspects, the first method utilizes existing LLR mapping tables corresponding to PDFs 510 and 520 and their histograms and updates the LLR tables for ICI consideration. In some implementations, the presence of inter-cell interference from the bottom cells will cause the voltage distributions to shift by one bin width or multiple bin widths depending on the bottom programming level. In certain implementations, the bottom programming levels L1 and L3 cause the PDFs to have a voltage shift to the right and bottom programming levels L0 and L2 cause a voltage shift to the left. In some implementations, there are no voltage shifts in the PDFs when the bottom programming levels are at L0 or L2.

FIG. 9 graphically illustrates an example where distributions 510 and 520 are shifted to the right by one bin width m. Bin width m is defined as the distance between any multiple read cycles. In the exemplary implementation, bin width m is the distance between the read voltage at line 532 and the read voltage at line 530. While only two voltage distributions for bit 1 and bit 0 are shown in FIG. 9, there can be more voltage distributions for other bits as in the MLC case. Also, the shift in voltage in distribution can also be in the left direction depending on the bottom programming levels and in some cases, the shift can be in multiple bin widths.

The shift in voltage distributions or PDFs is captured on distributions 510' and 520'. As a result of the voltage shift, the original area A of bin r1 moves to bins r1' and r2'. Thus, the existing LLR value of bin r1 can be used for bins r1' and r2'. Similarly, the original area B of bin r2 moves to bin r3' and thus, the existing LLR value of bin r2 can be used for bin r3'. Area C1 of bins r3 and area C2 of and r4 of the original PDF 520 move bin r4' as a result of the voltage shift. Thus, the LLR value of bin r3 and the LLR value of bin r4 can be used for bin r4'. Note that there is a loss of resolution in terms of LLR information because of the LLR values of bins r3 and r4 are used for just one bin, r4' and r1' and r2' have the same LLR values. Before the voltage shift in the exemplary implementation, there are four distinct LLR values; each corresponds to each of the four bins. After the shift, however, there are only three distinct LLR values. In the illustrated example, one bin shift m in the right direction is shown. The bin shift can be in multiple of bins and can also be in the left direction. For example, when the bottom programming level is L1 or L3, the voltage distributions can be shifted to the right by several bin widths. In other implementations, the voltage distribution can be shifted to the left when the bottom programming level is L0 or L2. In some implementations, there can be no shift in the voltage distributions when the bottom programming level is at L0 or L2.

In other words, if the LLR values belonging to PDFs 510 and 520 before the voltage shift are denoted as $\alpha_i$, where i corresponds to the bin number, and the new LLR values belonging to the shifted PDFs 510' and 520' are denoted by $\alpha_i'$, then:

$$\alpha_1' = \alpha_1; \quad (2)$$

$$\alpha_2' = \alpha_1; \quad (3)$$

$$\alpha_3' = \alpha_2; \quad (4)$$

and $$\alpha_4' = LLR(r4') = \log\frac{p(r_3, r_4 \mid x = 0)}{p(r_3, r_4 \mid x = 1)} \quad (5)$$

The different LLR values belonging to different bins and for different programming levels together are grouped in an LLR mapping table. In traditional decoding schemes, there is only one LLR mapping table. In the present implementation, there are at least two LLR mapping tables. The use of one LLR mapping table versus the multiple LLR mapping tables depends on the programming levels of the bottom cell. Further, different LLR mapping tables can be used for different age cycle of a memory device.

FIG. 10 illustrates various LLR mapping tables 100 for an MLC memory device. Tables 1, 2, 3, and 4 of FIG. 10 contain LLR values for bottom programming levels L 0, L1, L2, and L3, respectively. Each of the LLR mapping tables are constructed from an original LLR mapping table, as discussed above. Because the existing histograms are used and there is no new LLR computation for the new mapping table, implementation of the method of the present implementation is not computationally extensive and requires no or little hardware change.

As mentioned previously, there is a loss of resolution in terms of LLRs associated with an example of the present disclosure. For example, Table 3 of FIG. 10 shows the LLR values for bin r1' and r2' are the same. In spite of the loss in resolution of LLRs, the decoding performance associated with the method of the disclosed implementation is still better compared to the case where hard decision decoding is used.

FIGS. 11A, 11B and 11C illustrate the sector failure rates for a traditional method using hard decision decoding technique, the decoding using three reads with no ICI information, and the first method of an implementation of the present disclosure with three reads. As can be seen, there is an overall improvement as a memory device ages. In one implementation, there is as much as 68% improvement in the sector failure rate (at 150K and 3 hours) compared to the hard decision technique. In certain aspects, the LLR mapping table can be updated based on retention and endurance for better ICI mitigation. As a memory device age, it may be assumed that the voltage shift in the PDFs is in multiple of bin widths in the left or in the right direction. For example, at the beginning of life, it may be assumed that there is only one bin width in voltage shift when the bottom programming level is L3. However, at the end of life the LLR mapping table can be updated to reflect a two bin widths shift in voltage distribution. Since the original histograms for each bin were already obtained in the calibration process or are readily available, one can utilize the original histograms to obtain new LLR mapping tables based not only the bottom programming levels but also based on the retention and endurance conditions of a memory device.

Figure 12:
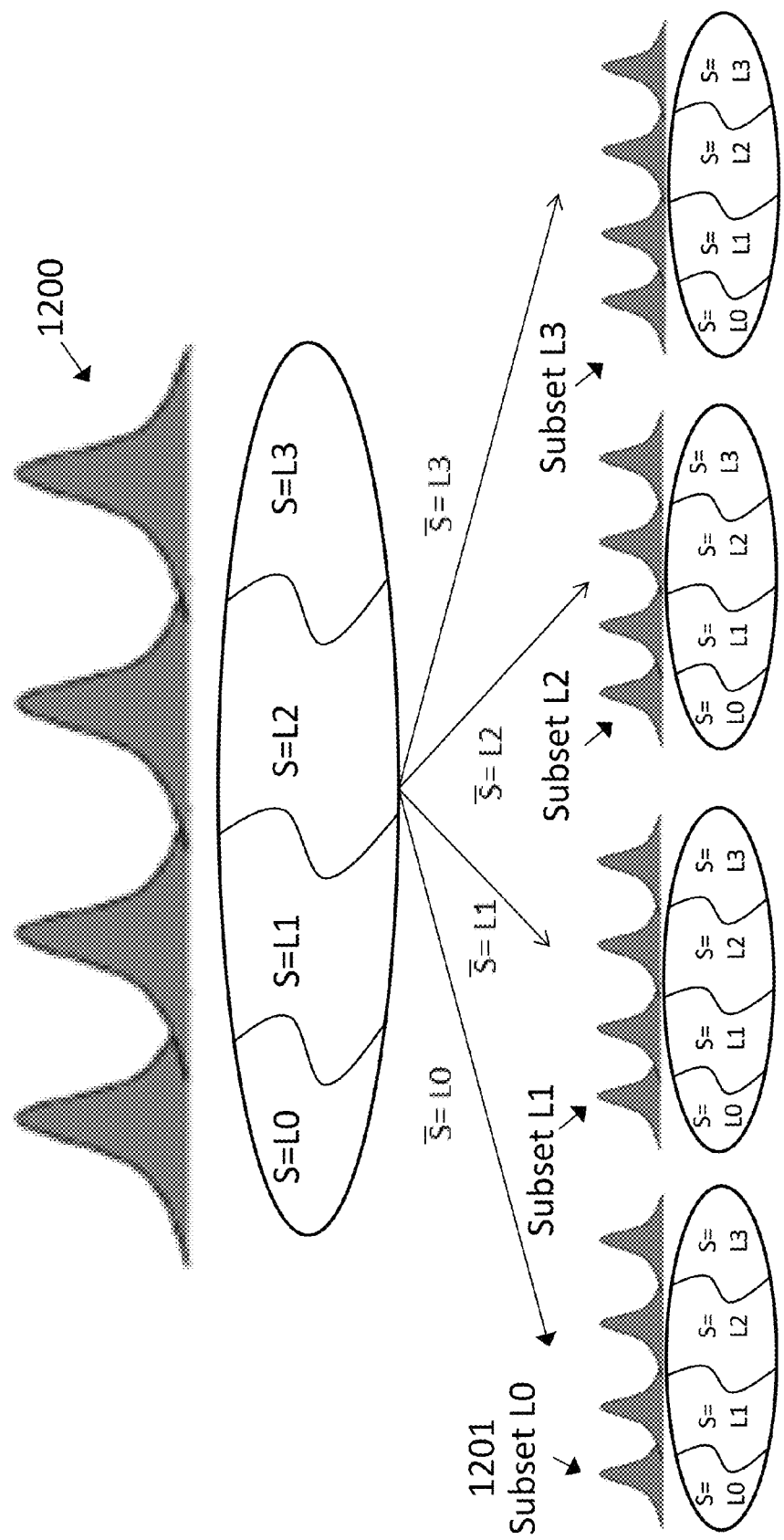
FIG. 12 conceptually illustrates a scheme of generating conditional PDFs for different programming level based on the sub-grouping concept of FIG. 7, according to some aspects of the present disclosure.

Referring to FIG. 12, a concept of subgrouping data based on the bottom programming level of method 1200 is illustrated. In some aspects, method 1200 produces better decoding performance than the method mentioned above. PDFs 1200 show the voltage distributions of memory cells in a four-level NAND type flash memory. The threshold voltages of the respective memory cells fall into any of areas L0, L1, L2, and L3 depending on the data programmed. The areas L0, L1, L2, and L3 correspond to 2-bit data "11", "10", "01", and "00", respectively and are called programming levels throughout the description of the present disclosure.

Instead of using one LLR mapping table for all data (PDFs 1200) as in the tradition method, method 1200 involves the use of four different LLR mapping tables. Each LLR mapping table is specific for each bottom programming level. In some implementations, it can be assumed that when a word line is decoded, the word line that is right below it has already been decoded so the bottom programming levels are already known. Thus, when a target cell is read, the programming level of the bottom cell is also obtained. Based on the obtained bottom programming level, a specific LLR mapping table is invoked. For example, the LLR mapping table of associated with Subset L0 can be invoked when the bottom programming level of the target cell is L0. Appropriate LLRs are then chosen from the invoked LLR mapping table and provided to the LDPC decoder as soft input.

In some implementations of method 1200, PDFs 1200 are provided by training data. That is, reference memory cells are programmed with known programming levels and the read values from the reference memory cells are obtained to provide PDFs 1200 for programming levels L0, L1, L2, and L3. Subset L0 is obtained by grouping all the read values of all the reference memory cells, where each of the cells has a corresponding bottom cell with the programming level of L0. PDFs 1201 for Subset L0 are then obtained and an LLR mapping table is generated for the subset. In a similar fashion, LLR mapping tables for Subset L1, Subset L2, and Subset L3 are generated.

In other words, each LLR value in a mapping table is calculated as follows:

$$LLR_i^b = \log \frac{\rho(ri \mid S = L_t, \bar{S} = L_b)}{\rho(ri \mid S = L_{t+1}, \bar{S} = L_b)} \quad (6)$$

where Sbar is a programming level in a bottom cell 310, Lb is any of the bottom programming levels L0-L3, S is a programming level in the target cell 320, ri is the bin information of the target cell, Lt and Lt+1 are two adjacent levels, (Lt, Lt+1) {(L1,L0), (L2,L1), (L3,L2)}, (e.g., (L0/L1) or (L1/L2) or (L2/L3), and $LLR_j^i$ is a conditional LLR for the read value of the target cell given the programming level Lb of the bottom cell.

In calculation of the empirical conditional probabilities, the original set of read values data is divided into four subsets. Because the number of data in each subset is less than the total number of the original set, it is more likely that some bins of the PDF vs. voltage graph (e.g., bins in FIG. 6) are empty. Specifically, this happens in the tailings of the distributions. In some implementations, the average LLR value then can be used for any of the empty bins.

In some implementations, the last word line of a block or the last programmed word line does not have any data from the bottom cells. The bottom programming level $L_b$ is therefore assumed to be L0 for conditional LLR calculation (e.g., Sbar=L0 in equation 6).

Figure 13:
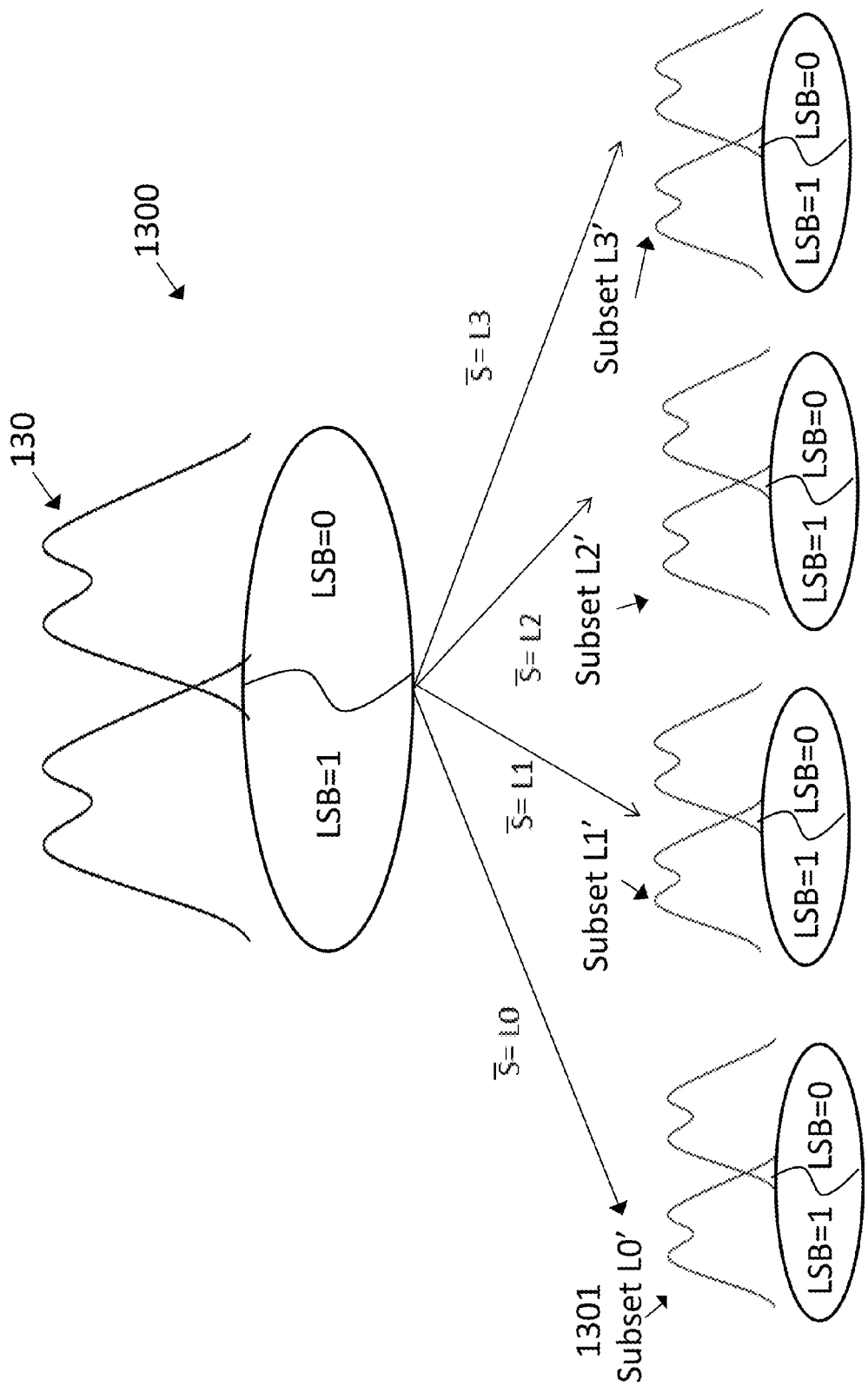
FIG. 13 conceptually illustrates a scheme of generating conditional PDFs for LSB page based on the sub-grouping concept of FIG. 7, according to some aspects of the present disclosure.

Turning now to FIG. 13, another concept of subgrouping data based on the bottom programming level of method 1300 is illustrated. Specifically, FIG. 13 illustrates a subgrouping method based on the LSB page. Similar to method 1200, method 1300 involves the subgrouping of an original data set based on the bottom programming levels. The PDFs for method 1300 however, is based on the programmed LSB page however. PDFs 130 illustrate probability density functions associated with probability of the least significant bit being one or zero, as a function of voltage as supposed to PDFs 120 of method 1200, which illustrate probability density functions based on four programming levels, L0-L3. Subset L0' is obtained by grouping all the read values of all the cells, where each of the cells has a corresponding bottom cell with the programming level of L0. The PDFs 1301 and histograms associated with the least significant bit being a zero or one are then generated. LLRs for different bins or regions in PDFs 1301 are then generated based on the obtained histograms. LLR values for other Subsets L1', Subset L2', and Subset L3', which correspond to groups of cells having bottom programming levels at L1, L2, and L3, respectively can also be obtained in a similar fashion.

Similarly, the LLR values for subsets of the MSB page can also be obtained and LLR values for both LSB and MSB pages are then combined to generate the LLR mapping tables for each bottom programming levels.

While methods 1200 and 1300 illustrate the PDFs of four programming levels in a case of two-bit MLC, it is understood that the same methods can be used to subgroup read values based on bottom programming levels for other multiple-bit MLC (e.g. three-bit MLC). For three-bit MLC, there will be eight subsets of data. The histograms and PDFS are then generated for each of the eight subsets and the LLR mapping table for each subset in turn, can also be obtained based on the generated histograms.

In some implementations, the ICI effect that is caused by bottom cells with programming level L0 is similar to that of programming level L2. Similarly, the ICI effect that is caused by bottom cells with programming level L1 is similar to that of programming level L3. As a result only two LLR mapping tables are utilized, one LLR mapping table for bottom programming levels L0 and L2 and one LLR mapping table for bottom programming levels L1 and L3. The reduced number of LLR mapping tables can be used at certain endurance and retention conditions, at beginning of life for example when flash memory systems are less prone to decoding failures. The reduced number of LLR mapping tables can also be used in other conditions, such as when memory resource is a problem, for example.

In other implementations, the LLR values are quantized to further reduce the use of resources (e.g. memory). In one implementation, LLR values are quantized to 7 bits where 5 bits are used for the integer part of the LLR value and 2 bits are used for the fractional part. Even in the quantized case, there are still significant improvements in the decoding performance when various methods of the present disclosure were used as compared to cases where ICI effects were not taken into consideration.

FIGS. 14A, 14B, 14C and 14D illustrate the sector failure rates for a traditional method using hard decision decoding technique, the decoding using three reads with no ICI information, method 1200 with three reads, and method 1300 with three reads, respectively in accordance with various implementations of the present disclosure. As can be seen, there is an overall improvement as a memory device ages. In one implementation, there is as much as 88% improvement in the sector failure rate when method 1200 is used. Better results can be seen with the use of method 1300. There is essentially no failure associated with the use of method 1300 in laboratory testing at 150,000 cycles.

It is noted that at 0 hour retention time and at 100K cycles of FIG. 14A, there are still some errors. FIG. 14A demonstrates that a traditional decoder that does not consider ICI is incapable of correcting some errors. In some implementations, the uncorrectable errors arise from the last word line. Thus, various methods that consider ICI of the present disclosure assume that each of the cells on the last word line has a bottom cell with a programming level of L0. In this way, appropriate LLR tables with the bottom programming level L0 are then invoked and used in the decoding process.

Figure 15:
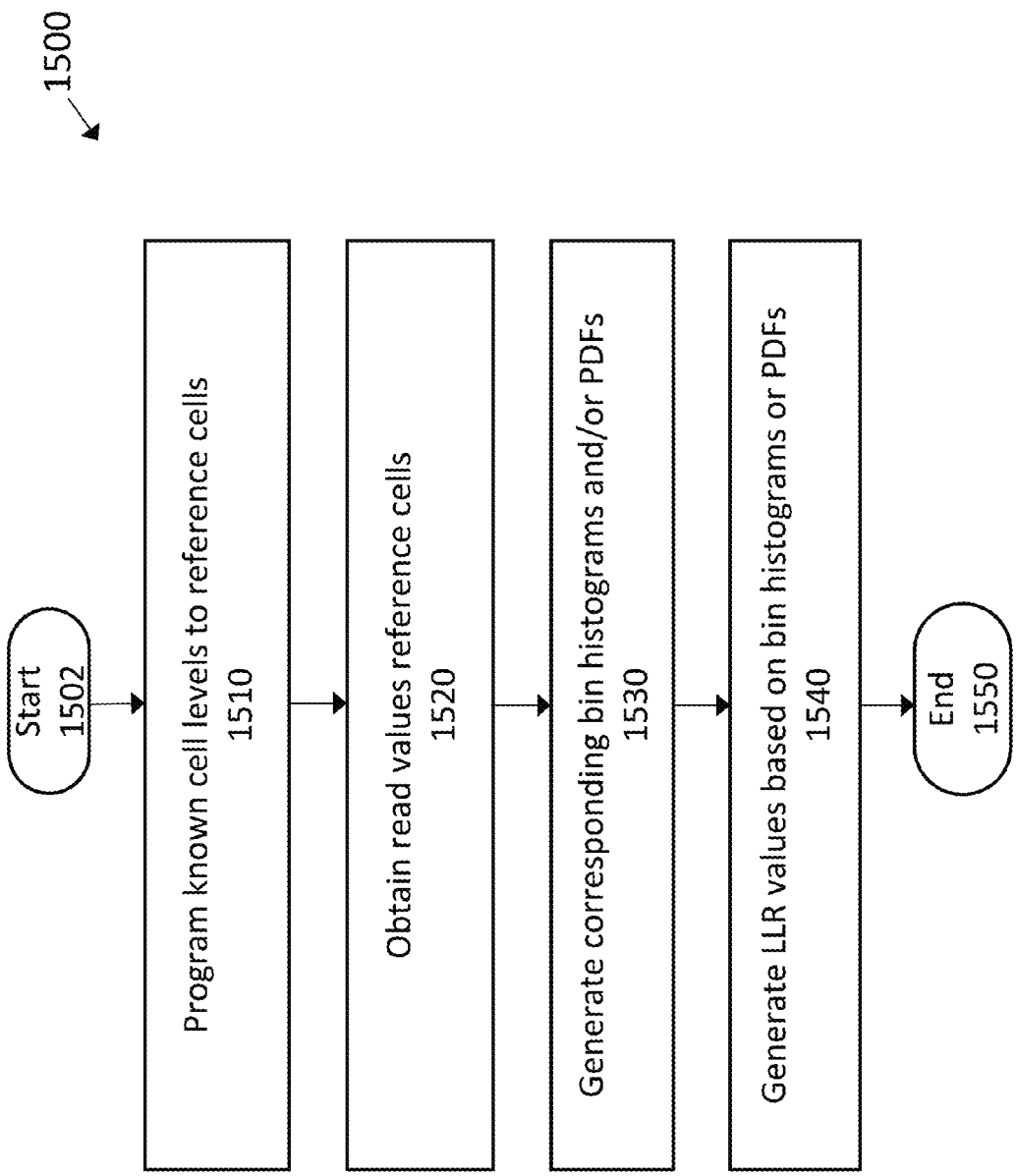
FIG. 15 illustrates process steps of generating LLR values, according to some aspects of the present disclosure.

FIG. 15 is a flowchart illustrating a method 1500 for generating original LLR values, in accordance with an implementation of the present disclosure. The method 1500, however, is exemplary. The method 1500 can be altered, e.g., by having stages added, changed, removed, or rearranged. One or more stages may be implemented by various modules of the ICI algorithm module 140 as described in reference to FIG. 1 above. One or more of the stages may be implemented on data storage system 20. For example, the one or more of the stages may be implemented as part of the controller 201. Alternatively, in some implementations, one or more of the stages may be implemented as a separate component to be operated in conjunction with the controller described above with respect to FIG. 2. The method 1500 may begin at stage 1502 and proceed to stage 1510.

At stage 1510, a group of reference cells are programmed at known levels. The reference cells are then read back and the read values are obtained at stage 1520. The cells might be read via one read cycle or multiple read cycles at each threshold voltage levels. The higher the read cycles the more the voltage bins can be generated, and the higher the number of LLR values can be obtained. At stage 1530, the histograms of the read values are obtained. At that stage, the PDFs can also be generated. At stage 1540, LLR value for each bin corresponding to the respective histogram is generated. All the LLR values then can be put in a table as a LLR mapping table. The method 1500 may end at stage 1550.

Method 1500 may be carried out during the calibration of the data storage system. Method 1500 may also be performed during the manufacturing process of the data storage system and the LLR mapping tables can be made available via storage medium 202 or an external device.

Figure 16:
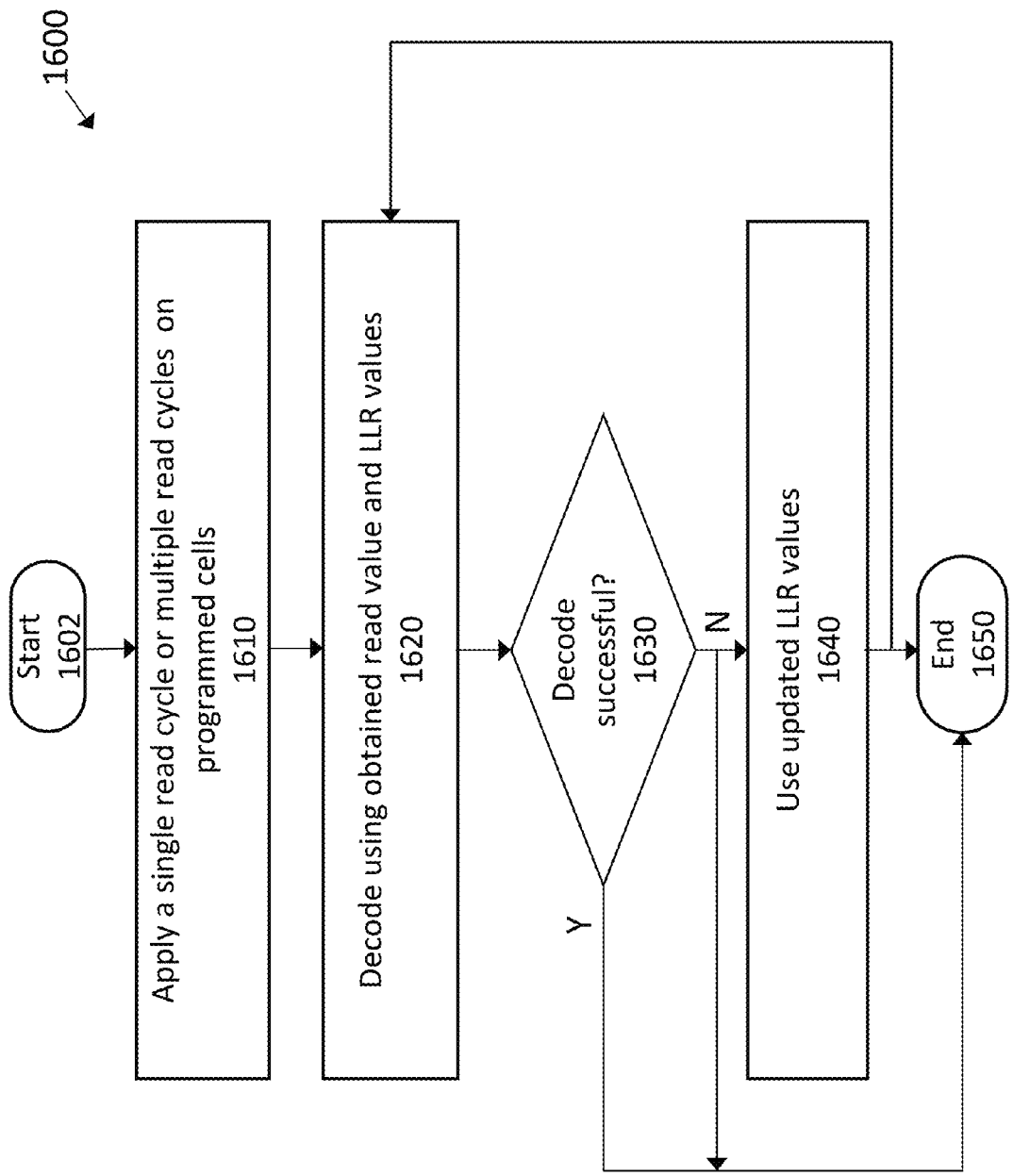
FIG. 16 illustrates process steps of decoding a read value obtaining from a memory cell, according to some aspects of the present disclosure.

FIG. 16 is a flowchart illustrating a decoding method 1600, in accordance with an implementation of the present disclosure. The method 1600, however, is exemplary. The method 1600 can be altered, e.g., by having stages added, changed, removed, or rearranged. One or more stages may be implemented by various modules residing in the ICI algorithm module 140 as described in reference to FIG. 1 above. One or more of the stages may be implemented on data storage system 20. For example, the one or more of the stages may be implemented as part of the controller 201. Alternatively, in some implementations, one or more of the stages may be implemented as a separate component to be operated in conjunction with the controller described above with respect to FIG. 2. The method 1600 may begin at stage 1602 and proceed to stage 1610.

At stage 1610, the controller 201 of a flash memory device may receive a read instruction and in response the controller 201 causes certain programmed cells to be read. The cells may be read based on a single read cycle or multiple read cycles. During a read cycle, the read module 142 applies a reference voltage Vt to individual memory cells of memory 110. For a given memory cell, the read module 142 determines whether a voltage level of the memory cell is higher or lower compared to the applied reference voltage Vt and puts the read output result in the appropriate bin.

At stage 1620, the read output of the memory cells is decoded. In one implementation, when a code word is first being decoded, a LLR value may be obtained from an original LLR table. The original LLR table can be obtained from method 1500 as described previously or is available in a storage medium at is produced at the time of manufacturing or available via an external device. The LLR value and the obtained read value are then sent to the decoder for decoding.

At stage 1630, it is determined if the decoding is successful. If the decoding is successful, the method 1600 may end at stage 1650. If the decoding is not successful, the method 1600 may proceed to stage 1640. Alternatively, the method 1600 may end and a determination of a read failure is declared.

At stage 1640, an updated LLR value is obtained. The updated LLR value can be obtained from any of the LLR mapping tables associated with various methods, such as the voltage distribution shift, cell-level based voltage distribution, and MSB/LSB page based voltage distribution methods as described in various implementations.

In one implementation, when the decoding process is not successful, the LLR mapping table associated with the voltage distribution shift is used and the updated LLR values from that table are chosen. The method then goes back to stage 1620 for decoding. Stage 1630 is then repeated to determine if the decoding process is successful. If the decoding process is not successful, the method 1600 may go to stage 1640 to pick another LLR mapping table such as the LLR mapping table associated with the cell-level based voltage distribution. Alternatively, the method 1600 may end. If the method proceeds to stage 1640 again, the updated LLR values are then chosen from the table and fed to the decoder at stage 1620 for decoding. If the decoding process is successful, the method 1600 may end at stage 1650 or repeated by proceeding to stage 1640. At stage 1640, the LLR mapping table associated with the MSB/LSB page based voltage distribution may be selected. The LLR values are then obtained from the table and fed to the decoder at stage 1620. If the decoding process is successful, the method 1600 may end. If the decoding process is not successful, the method 1600 may still end, however, a determination of read failure is declared on the attempted memory cells.

In one implementation, the appropriate LLR mapping table is dynamically selected based on the operating conditions. For example, the appropriate LLR mapping table can be selected based on the endurance or life of a flash device. At beginning of life of a flash device, the LLR mapping table associated with the voltage shift method may be selected. At the middle of life, a LLR mapping table associated with cell-level based distributions method may be used. At the end of life, a LLR mapping table associated with MSB/LSB based distributions method may be used. The type of LLR mapping table may also be chosen based on a predetermined number of program/erase cycles and/or the extent of failure rate of a device, for example. The updated LLR chosen from the LLR mapping table is then used for decoding. This step may be reiterated many times until the decoding process is successful or all of the available LLR mapping tables are used. In one implementation, the various LLR mapping tables are available in a storage medium or are produced at the time of manufacturing or available via an external device. In other implementations, the LLR mapping tables are obtained from the calibration process of method 1500 as described previously or from methods 1700, 1800, 1900 as described below.

Figure 17:
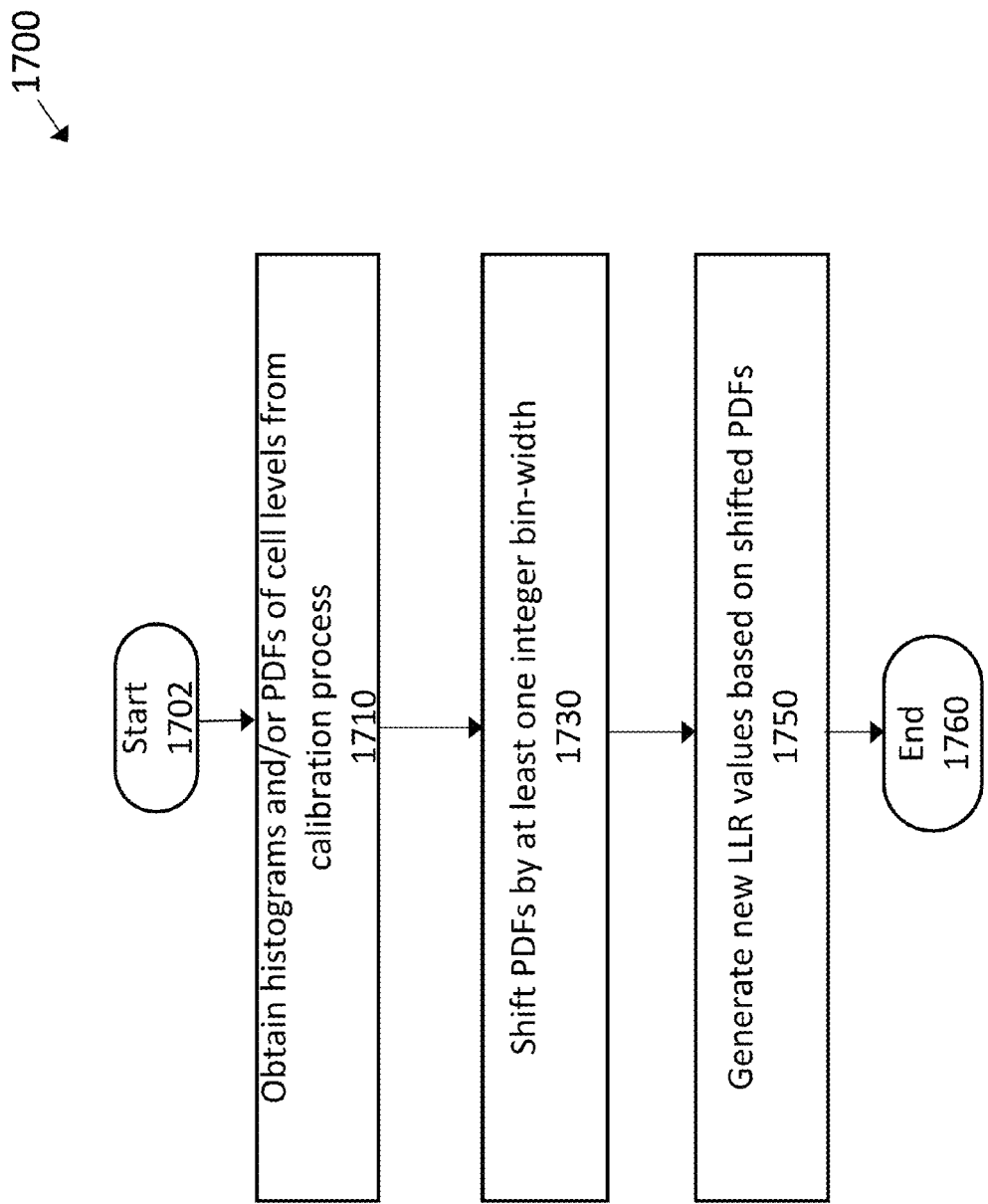
FIG. 17 illustrates process steps of generating LLR values based on the voltage shift method, according to some aspects of the present disclosure.

FIG. 17 is a flowchart illustrating a method 1700 for generating LLR values, in accordance with an implementation of the present disclosure. The method 1700, however, is exemplary. The method 1700 can be altered, e.g., by having stages added, changed, removed, or rearranged. One or more stages may be implemented by various modules residing in the ICI algorithm module 140 as described in reference to FIG. 1 above. One or more of the stages may be implemented on data storage system 20. For example, the one or more of the stages may be implemented as part of the controller 201. Alternatively, in some implementations, one or more of the stages may be implemented as a separate component to be operated in conjunction with the controller described above with respect to FIG. 2. Method 1700 may be carried out during the calibration of the data storage system. Method 1700 may also be performed during the manufacturing process of the data storage system and the LLR tables are made available via storage medium 202 or an external device.

The method 1700 may begin at stage 1702 and proceed to stage 1710.

At stage 1710, the histograms and optionally PDFs of all the read values are obtained. In one implementation, the histograms and the PDFs are obtained from the calibration process of FIG. 15. The method 1700 may then proceed to stage 1730. At stage 1730, the obtained PDFs are shifted to the right by at least one integer bin-width. At stage 1750, the LLR values for all the bins are calculated as discussed previously. In one implementation, the PDFs are shifted to the right by two bin widths and the corresponding LLR values are obtained. The LLR values can be put in form of a LLR mapping table. The new LLR values of the right shifted PDFs can be used in the decoding process when it is determined that if the bottom programming level of a target cell is at programming level L1 and L3. Also at this stage, the obtained PDFs from step 1710 are shifted to the left by at least one bin width. The LLR values are then obtained for all the bins and may be put in a table format as a LLR mapping table. The new LLR values of the left shifted PDFs can be used in the decoding process for read values of cells that have bottom programming levels of L0 or L2.

Upon generating the new LLR values from the shifted PDFs, the method 1700 may end at stage 1760.

Figure 18:
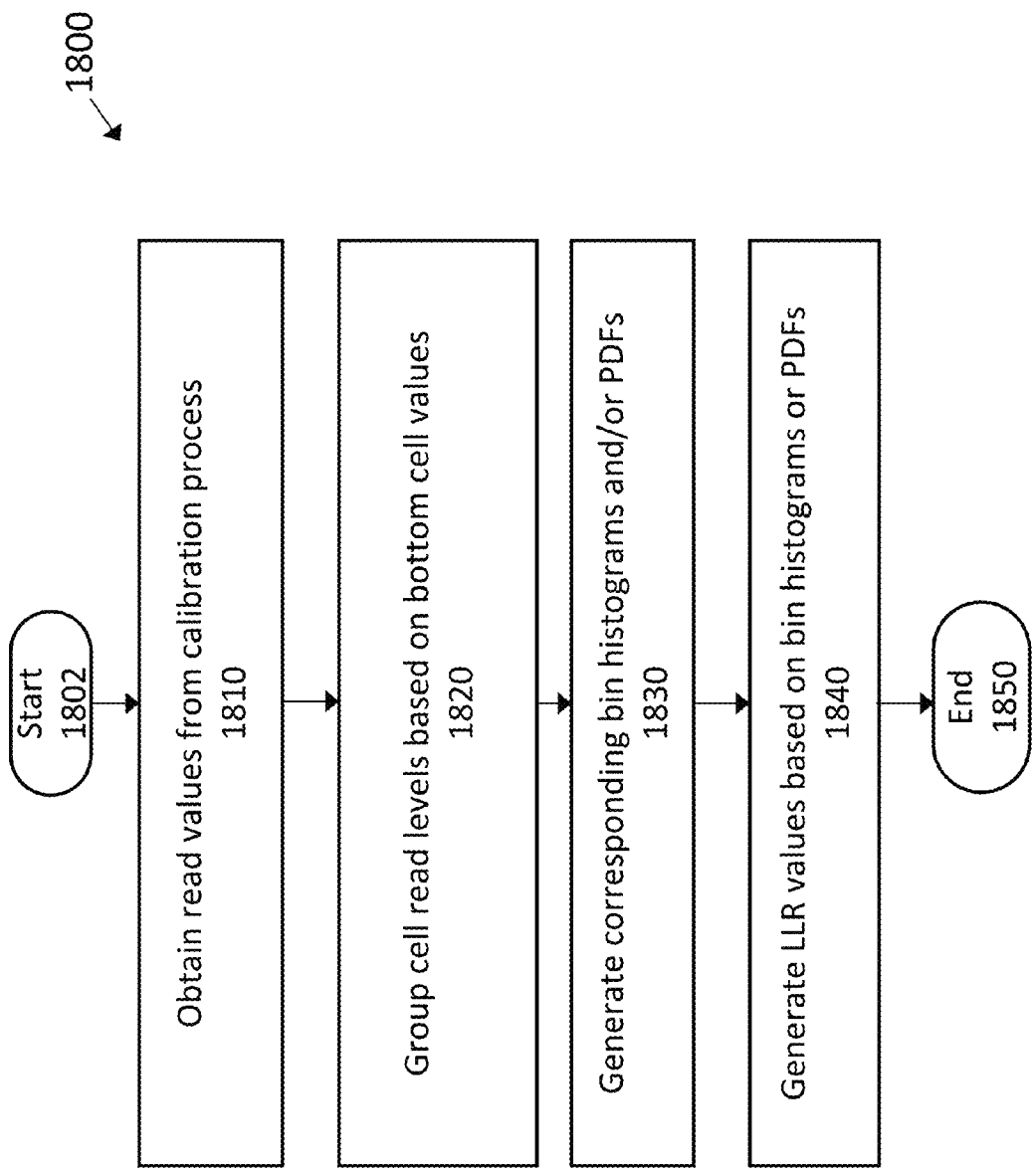
FIG. 18 illustrates process steps of generating LLR values based on group-based voltage distributions for programming levels, according to an exemplary method of the present disclosure.

FIG. 18 is a flowchart illustrating a method 1800 for generating LLR values, in accordance with an implementation of the present disclosure. The method 1800, however, is exemplary. The method 1800 can be altered, e.g., by having stages added, changed, removed, or rearranged. One or more stages may be implemented by the ICI algorithm module 140 as described in reference to FIG. 1 above. One or more of the stages may be implemented on data storage system 20. For example, the one or more of the stages may be implemented as part of the controller 201. Alternatively, in some implementations, one or more of the stages may be implemented as a separate component to be operated in conjunction with the controller described above with respect to FIG. 2. Method 1800 may be carried out during the calibration of the data storage system. Method 1800 may also be performed during the manufacturing process of the data storage system and the LLR tables are made available via storage medium 202 or an external device.

The method 1800 may begin at stage 1802 and proceed to stage 1810.

At stage 1810, the read values of reference cells are obtained. In one implementation, the read values are obtained from the calibration process of FIG. 15. The method 1800 may then proceed to stage 1820. At stage 1820, the read values data are grouped into subsets: Subset L0, Subset L1, Subset L2, and Subset L3 in accordance to the bottom programming levels as shown in FIG. 7. For example, Subset L0 indicates a sub-grouping of cells on word line n+1, where each of the cells in the subgroup has a bottom cell located on word line n with a programming level of L0. At stage 1830, bin histograms and PDFS are obtained for each subset and at stage 1840 the LLR values corresponding to histograms are generated. All the LLR values of Subset L0 are put in a LLR mapping table, which can be used in the decoding process for read values of cells that have bottom programming levels of L0. Similarly, LLR values for Subset L1, L2, and L3 can be used in the decoding process for read values of cells that have bottom programming levels of L1, L2, and L3, respectively.

Upon generating the new LLRs for each subset, the method 1800 may end at stage 1850.

Figure 19:
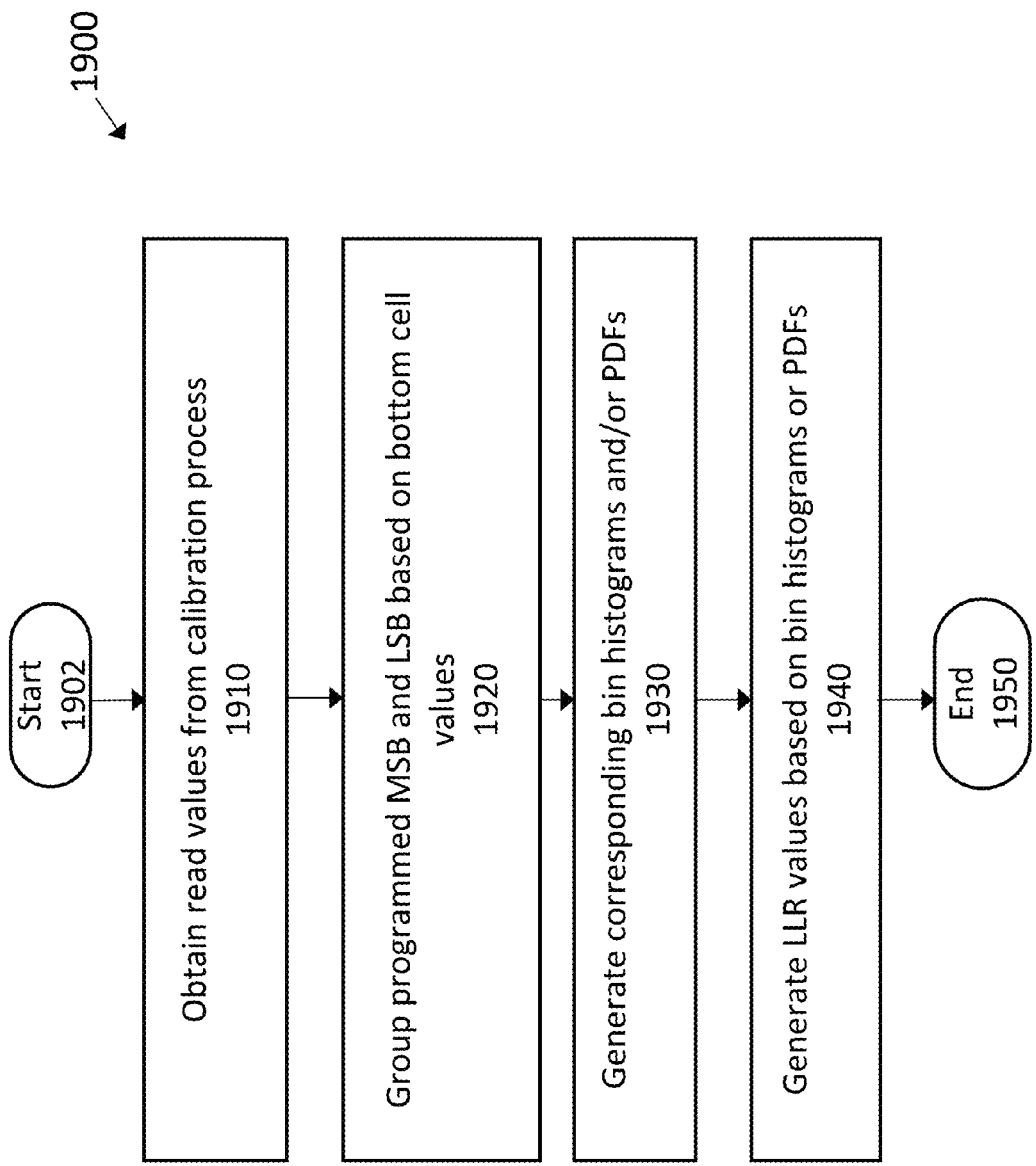
FIG. 19 illustrates process steps of generating LLR values based on group-based voltage distributions for programmed pages, according to an exemplary method of the present disclosure.

FIG. 19 is a flowchart illustrating a method 1900 for generating LLR values, in accordance with an implementation of the present disclosure. The method 1900, however, is exemplary. The method 1900 can be altered, e.g., by having stages added, changed, removed, or rearranged. One or more stages may be implemented by the ICI algorithm module 140 as described in reference to FIG. 1 above. One or more of the stages may be implemented on data storage system 20. For example, the one or more of the stages may be implemented as part of the controller 201. Alternatively, in some implementations, one or more of the stages may be implemented as a separate component to be operated in conjunction with the controller described above with respect to FIG. 2. Method 1900 may be carried out during the calibration of the data storage system. Method 1900 may also be performed during the manufacturing process of the data storage system and the LLR tables are made available via storage medium 202 or an external device.

The method 1900 may begin at stage 1902 and proceed to stage 1910.

At stage 1910, the read values of reference cells are obtained. In some implementations, the read values are obtained from the calibration process of FIG. 15. The method 1900 may then proceed to stage 1920. At stage 1920, the read values are grouped into subsets similar to those described in FIG. 13. Particularly, the read values are grouped into four subsets: Subset 1301, Subset 1302, Subset 1303, and Subset 1304 in accordance to the bottom programming levels as shown in FIG. 13. For example, Subset 1301 indicates a sub-grouping of the LSB on word line n+1, where each bit in the subgroup has a bottom cell located on word line n with a programming level of L0. At stage 1930, bin histograms and PDFS are obtained for each subset and at stage 1940 the LLR values corresponding to histograms are generated. The LLR values for the MSB page are also obtained similarly through stages 1920 ad 1940. Further, at stage 1940 all the LLR values are put together in form of an LLR mapping table for each bottom programming level.

The LLR mapping table of Subset 1301 can be used in the decoding process for read values of cells that have bottom programming levels of L0. Similarly, LLR mapping tables for Subsets 1302, 1303, and 1304 can be used in the decoding process for read values of cells that have bottom programming levels of L1, L2, and L3, respectively.

Upon generating the new LLRs for each subset, the method 1900 may end at stage 1950.

FIG. 20 illustrates an example of a method 2000 for reading information stored in a flash memory device, according to some aspects of the disclosure. The method begins with stage 2002 in which one or more processors execute code to perform instructions for implementing the stages of method 2000. In stage 2004, a first read signal of a first cell is obtained, wherein the first cell is located in a first word line and a first bit line in a flash memory device.

Next, method 2000 proceeds to stage 2006 wherein a programming level of a second cell is obtained. In some implementations, the second cell will be located in a second word line and in the bit line (e.g., the same bit line as the first cell), wherein the second word line is adjacent to the first word line. As discussed above, inter-cell interference effects can be particularly pronounced as between memory cells that are adjacently located in the same bit line. Thus, the inter-cell interference effects of charges stored to the second cell can affect the storage of charge on the first cell, which can be, for example, located above the second cell on the first word line.

In stage 1208, decoding information for the first cell is obtained based on the programming level of the second cell. The obtained decoding information may be retrieved from one or more tables (e.g., LLR tables) that include data relating to an amount of voltage shift that can be imparted by adjacently situated cells on one another. As discussed above, such voltage shifts are the result of inter-cell interference, and can be dependent upon an the programming levels (or "cell levels") with which a particular cell has been programmed.

For example inter-cell interference in a NAND flash may result from the parasitic capacitance around the floating gate. In some instances, when a cell is programmed, the parasitic capacitance can cause voltage shifts (i.e., $V_t$ shifts) in the neighboring cells. This shift can be linearly related to the voltage applied to the cell. In some cell configurations, has been shown that the bottom cell contributes a significant amount of ICI, as compared to the other neighboring cells.

Although the effects of ICI may be accounted for in various ways, aspects of the subject technology provide for systems and methods may be implemented to mitigate the effects of ICI on a flash output sequences that are decoded to read information out of a flash device. By way of example, implementations of the subject technology can include methods for receiving, at a storage processor, a reading instruction; and in response to the reading instruction, obtaining a read value of a first cell located on a first word line and a first bit line; obtaining a programming level of a second cell, wherein the second cell is located along the first bit line and on a second word line that is directly below the first word line; and obtaining a log-likelihood ratio (LLR) value for the read value of the first cell, wherein the LLR value is associated with the programming level of the second cell.

In one implementation, the LLR value is derived from a shifted reference voltage distribution of a set of reference cells. A shift in the shifted reference voltage distribution may be in the left or the right in one or multiple bin widths, where one bin width is a distance between two consecutive reads in a multiple read cycle, for example. In one implementation, the shift is one bin width to the right when the programming level of a bottom cell is L1 or L3. In another implementation, the shift is one bin width to the left when the programming level of a bottom cell is L0 or L2.

In another implementation, the LLR value is derived from a voltage distribution of a subset of reference cells, where each of the cells in the subset is one word line above another reference cell with a certain programming level. In one implementation the voltage distribution is derived from a probability density function of a programming level. In yet another implementation, the voltage distribution is derived from a probability density function of a programmed bit or a programmed page. In particular, the voltage distribution is associated with probability of data bits being zero or one, as a function of voltage. In other implementations, the voltage distribution is associated with a probability of programming levels at L0, L1, L2, or L3 for a case of MLC.

In one implementation, the method further includes step of programming known programming levels to a plurality of reference cells along a word line; reading the plurality of reference cells located along the word line; generating a plurality of reference read values based on the reading of the plurality of reference cells; obtaining a plurality of reference voltage distributions for all programming levels associated with histograms of the plurality of reference read values; and generating special voltage distributions from which the LLR values are derived from.

In one implementation, the special voltage distribution is generated by creating a shift in a of reference voltage distribution. In another implementation, the special voltage distribution is generated by creating subsets of reference cells, where each of the cells in the subset is one word line above another reference cell with a certain programming level. In one implementation the special voltage distribution is associated with a probability density function of a programming level. In yet another implementation, the special voltage distribution is associated with a probability density function of a programmed bit or a programmed page.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes can be rearranged. For example, in some implementations some of the steps can be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the scope of the present disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all implementations, or one or more implementations. An implementation may provide one or more examples. A phrase such as an "embodiment" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for reading information stored in a flash memory device, comprising:
   obtaining a first read signal of a first cell, wherein the first cell is located in a first word line and a first bit line in the flash memory device;
   obtaining a programming level of a second cell, wherein the second cell is located in a second word line and the first bit line, and wherein the second word line is adjacent to the first word line; and
   obtaining decoding information for the first cell based on the programming level of the second cell, wherein the decoding information is derived from a shifted reference voltage distribution of a set of reference cells, and wherein the reference voltage distribution is shifted at least one bin width based on the programming level of the second cell.

2. The method of claim 1, further comprising:
   decoding the first read signal of the first cell based on the decoding information.

3. The method of claim 1, wherein the decoding information comprises one or more LLR values.

4. The method of claim 1, wherein obtaining the decoding information for the first cell further comprises:
   referencing one or more LLR mapping tables corresponding with one or more programming levels; and
   selecting one or more LLR values from the one or more LLR mapping tables based on the programming level of the second cell.

5. The method of claim 1, wherein the decoding information is based on inter-cell interference (ICI) data.

6. The method of claim 1, wherein obtaining the decoding information further comprises:
   obtaining a plurality of reference voltage distributions for all programming levels associated with histograms of a plurality of read values; and
   shifting one or more of the plurality of reference voltage distributions to produce one or more shifted reference voltage distributions.

7. The method of claim 1, wherein obtaining the decoding information further comprises:
   programming known programming levels to a plurality of reference cells along a first reference word line and a second reference word line, wherein the second reference word line is immediately below the first reference word line; and wherein
   the decoding information is based on information obtained by reading the plurality of reference cells.

8. The method of claim 1, wherein the reference voltage distribution is shifted at least one bin width to the right when the programming level of the second cell is L1 or L3.

9. The method of claim 1, wherein the shifted reference voltage distribution is shifted at least one bin width to the when the programming level of the second cell is L0 or L2.

10. The method of claim 1, wherein the wherein the decoding information comprises one or more LLR values represented as an expression or an element of a stored table.

11. A data storage system, comprising:
    a configuration memory;
    a plurality of memory cells; and
    a controller coupled to the configuration memory and the plurality of memory cells, wherein the controller is configured to perform operations for:
       obtaining a first read signal of a first cell, wherein the first cell is located in a first word line and a first bit line in the data storage system;
       obtaining a programming level of a second cell, wherein the second cell is located in a second word line and the first bit line, and wherein the second word line is adjacent to the first word line; and
       obtaining decoding information for the first cell based on the programming level of the second cell, wherein the decoding information is derived from a shifted reference voltage distribution of a set of reference cells, and wherein the reference voltage distribution is shifted at least one bin width based on the programming level of the second cell.

12. The data storage system of claim 11, further comprising:
    decoding the first read signal of the first cell based on the decoding information.

13. The data storage system of claim 11, wherein the decoding information comprises one or more LLR values.

14. The data storage system of claim 11, wherein obtaining the decoding information for the first cell further comprises:
    referencing one or more LLR mapping tables corresponding with one or more programming levels; and
    selecting one or more LLR values from the one or more LLR mapping tables based on the programming level of the second cell.

15. The data storage system of claim 11, wherein the decoding information is based on inter-cell interference (ICI) data.

16. The data storage system of claim 11, wherein obtaining the decoding information further comprises:
    obtaining a plurality of reference voltage distributions for all programming levels associated with histograms of a plurality of read values; and
    shifting one or more of the plurality of reference voltage distributions to produce one or more shifted reference voltage distributions.

17. The data storage system of claim 11, wherein obtaining the decoding information further comprises:
    programming known programming levels to a plurality of reference cells along a first reference word line and a second reference word line, wherein the second reference word line is immediately below the first reference word line; and wherein
    the decoding information is based on information obtained by reading the plurality of reference cells.

18. The data storage system of claim 11, wherein the reference voltage distribution is shifted at least one bin width to the right when the programming level of the second cell is L1 or L3.

19. The data storage system of claim 11, wherein the reference voltage distribution is shifted at least one bin width to the left when the programming level of the second cell is L0 or L2.

20. The data storage system of claim 11, wherein the wherein the decoding information comprises one or more LLR values represented as an expression or an element of a stored table.

21. An article of manufacture for providing soft information to facilitate decoding of information read from an electronic storage, the article of manufacture comprising:
- at least one non-transitory processor readable storage medium; and
- instructions stored on the at least one medium;
- wherein the instructions are configured to be readable from the at least one medium by at least one processor and thereby cause the at least one processor to perform operations for:
  - obtaining a first read signal of a first cell, wherein the first cell is located in a first word line and a first bit line in a flash memory device;
  - obtaining a programming level of a second cell, wherein the second cell is located in a second word line and the first bit line, and wherein the second word line is adjacent to the first word line; and
  - obtaining decoding information for the first cell based on the programming level of the second cell, wherein the decoding information is derived from a shifted reference voltage distribution of a set of reference cells, and wherein the reference voltage distribution is shifted at least one bin width based on the programming level of the second cell.

22. The article of manufacture of claim 21, wherein the at least one processor is configured to perform operations for:
- decoding the first read signal of the first cell based on the decoding information.

23. The article of manufacture of claim 21, wherein the decoding information comprises one or more LLR values.

24. The article of manufacture of claim 21, wherein obtaining the decoding information for the first cell further comprises:
- referencing one or more LLR mapping tables corresponding with one or more programming levels; and
- selecting one or more LLR values from the one or more LLR mapping tables based on the programming level of the second cell.

25. The article of manufacture of claim 21, wherein the decoding information is based on inter-cell interference (ICI) data.

26. The article of manufacture of claim 21, wherein obtaining the decoding information further comprises:
- obtaining a plurality of reference voltage distributions for all programming levels associated with histograms of a plurality of read values; and
- shifting one or more of the plurality of reference voltage distributions to produce one or more shifted reference voltage distributions.

27. The article of manufacture of claim 21, wherein obtaining the decoding information further comprises:
- programming known programming levels to a plurality of reference cells along a first reference word line and a second reference word line, wherein the second reference word line is immediately below the first reference word line; and wherein
- the decoding information is based on information obtained by reading the plurality of reference cells.

28. The article of manufacture of claim 21, wherein the reference voltage distribution is shifted at least one bin width to the right of the first cell when the programming level of the second cell is L1 or L3.

29. The article of manufacture of claim 21, wherein the reference voltage distribution is shifted at least one bin width to the left of the first cell when the programming level of the second cell is L0 or L2.

30. The article of manufacture of claim 21, wherein the wherein the decoding information comprises one or more LLR values represented as an expression or an element of a stored table.

* * * * *